United States Patent
Sano et al.

(10) Patent No.: US 11,711,010 B2
(45) Date of Patent: Jul. 25, 2023

(54) DRIVE CIRCUIT AND INVERTER DEVICE

(71) Applicant: Mitsubishi Electric Corporation, Tokyo (JP)

(72) Inventors: Shohei Sano, Fukuoka (JP); Akihisa Yamamoto, Tokyo (JP); Mitsutaka Hano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/231,795

(22) Filed: Apr. 15, 2021

(65) Prior Publication Data

US 2022/0069695 A1    Mar. 3, 2022

(30) Foreign Application Priority Data

Aug. 27, 2020    (JP) ................. 2020-143766

(51) Int. Cl.
*H02M 1/08* (2006.01)
*H02M 7/537* (2006.01)
(Continued)

(52) U.S. Cl.
CPC .......... *H02M 1/08* (2013.01); *H02M 1/0006* (2021.05); *H02M 7/537* (2013.01); *H01L 29/7817* (2013.01)

(58) Field of Classification Search
CPC ...... H02M 1/08; H02M 1/0006; H02M 1/088; H02M 7/537; H02M 7/53871;
(Continued)

(56) References Cited

U.S. PATENT DOCUMENTS 5,502,632 A * 3/1996 Warmerdam ........ H03K 17/063
363/17
5,666,280 A * 9/1997 Janaswamy .......... H03K 17/063
363/17
(Continued)

FOREIGN PATENT DOCUMENTS

JP    H11-068531 A    3/1999
JP    2006-087089 A    3/2006
(Continued)

OTHER PUBLICATIONS

Imasaka et al., JP Application No. 2019-234187; filed Dec. 25, 2019, which corresponds to U.S. Appl. No. 17/075,032.
(Continued)

*Primary Examiner* — Kyle J Moody
*Assistant Examiner* — Jye-June Lee
(74) *Attorney, Agent, or Firm* — Studebaker & Brackett PC

(57) ABSTRACT

A drive circuit includes a first driver to control on/off of an upper arm, a second driver to control on/off of a lower arm, a first switching device including a first terminal connected with a power supply for the first driver, a second terminal connected with a power supply for the second driver and a control terminal, a booster circuit to turn on the first switching device by boosting a control signal which is at a high level when the lower arm is in an on state, a second switching device to cause continuity between the control terminal and the booster circuit when the control signal is at the high level, and first switch unit to short-circuit the control terminal and the terminal for grounding when the control signal is at the low level.

17 Claims, 21 Drawing Sheets

(51) Int. Cl.
*H02M 1/00* (2006.01)
*H01L 29/78* (2006.01)

(58) Field of Classification Search
CPC ............ H01L 29/7817; H01L 29/7835; H03K 2217/0063; H03K 2217/0072; H03K 17/04123; H03K 17/74; H03K 17/063; H03K 17/162
See application file for complete search history.

(56) References Cited

U.S. PATENT DOCUMENTS

| | | | |
|---|---|---|---|
| 6,060,948 A | 5/2000 | Tarantola et al. | |
| 2005/0102128 A1 | 5/2005 | Wilhelm | |
| 2006/0044051 A1* | 3/2006 | Locatelli | G05F 1/618 327/536 |
| 2007/0159150 A1* | 7/2007 | Hosokawa | H03K 17/063 323/285 |
| 2007/0236283 A1* | 10/2007 | Locatelli | H03K 17/063 327/589 |
| 2008/0007317 A1* | 1/2008 | Bodano | H03K 17/063 327/390 |
| 2008/0218141 A1* | 9/2008 | Lu | H03K 17/162 323/282 |
| 2008/0258808 A1* | 10/2008 | Locatelli | H02M 7/538 327/589 |
| 2014/0191732 A1* | 7/2014 | Tseng | H02M 1/36 320/166 |
| 2015/0188328 A1* | 7/2015 | Abouda | H02M 1/08 123/478 |
| 2017/0345887 A1 | 11/2017 | Ichikawa | |
| 2018/0167065 A1* | 6/2018 | Chan | H03K 17/06 |
| 2020/0169253 A1* | 5/2020 | Hano | H02M 1/08 |
| 2020/0203474 A1 | 6/2020 | Yoshino | |
| 2021/0091655 A1* | 3/2021 | Hegde | H02M 1/08 |

FOREIGN PATENT DOCUMENTS

| | | |
|---|---|---|
| JP | 2007-513543 A | 5/2007 |
| WO | 2018/051412 A1 | 3/2018 |

OTHER PUBLICATIONS

Imasaka et al., U.S. Appl. No. 17/075,032, filed Oct. 20, 2020, which corresponds to JP Application No. 2019-234187.
Shimizu et al., JP Application No. 2019-206408, filed Nov. 14, 2019, which corresponds to U.S. Appl. No. 17/017,995.
Shimizu et al., U.S. Appl. No. 17/017,995, filed Sep. 11, 2020, which corresponds to JP Application No. 2019-206408.
An Office Action mailed by the United States Patent and Trademark Office dated Mar. 11, 2022, issued in U.S. Appl. No. 17/231,795 which is related to U.S. Appl. No. 17/231,795.
An Office Action mailed by the United States Patent and Trademark Office dated Aug. 22, 2022, issued in U.S. Appl. No. 17/075,032 which is related to U.S. Appl. No. 17/231,795.
An Office Action; "Notice of Reasons for Refusal," mailed by the Japanese Patent Office dated May 16, 2023, which corresponds to Japanese Patent Application No. 2020-143766 and is related to U.S. Appl. No. 17/231,795; with English language translation.

* cited by examiner

FIG.5 --Prior Art--
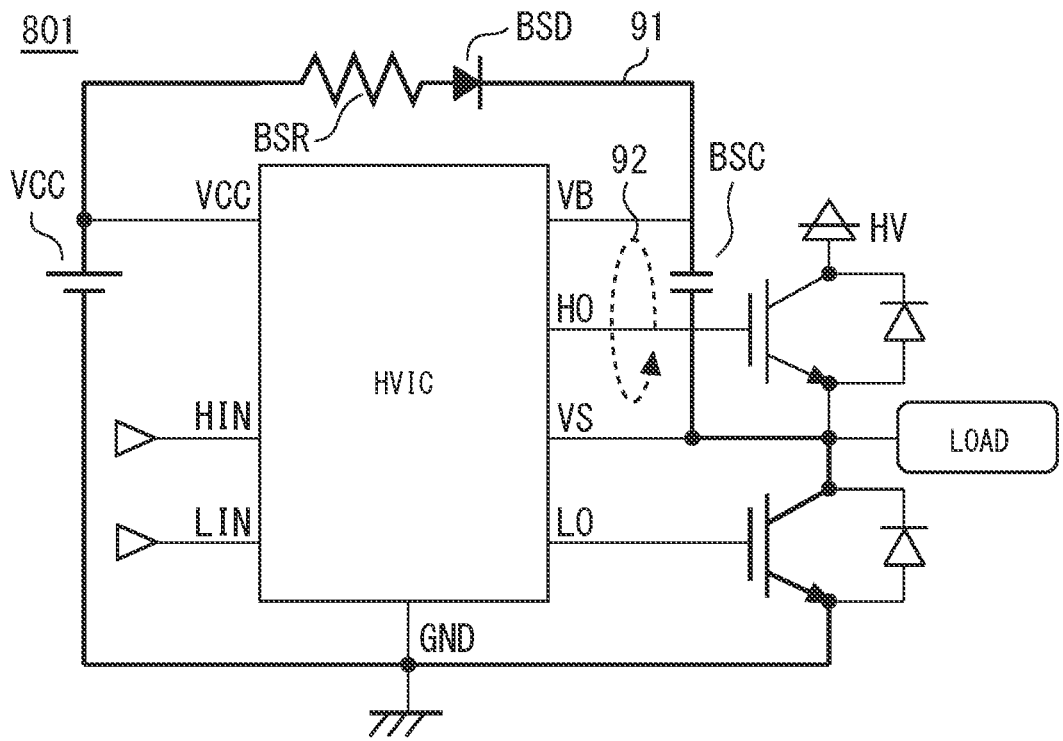
FIG.6 --Prior Art--
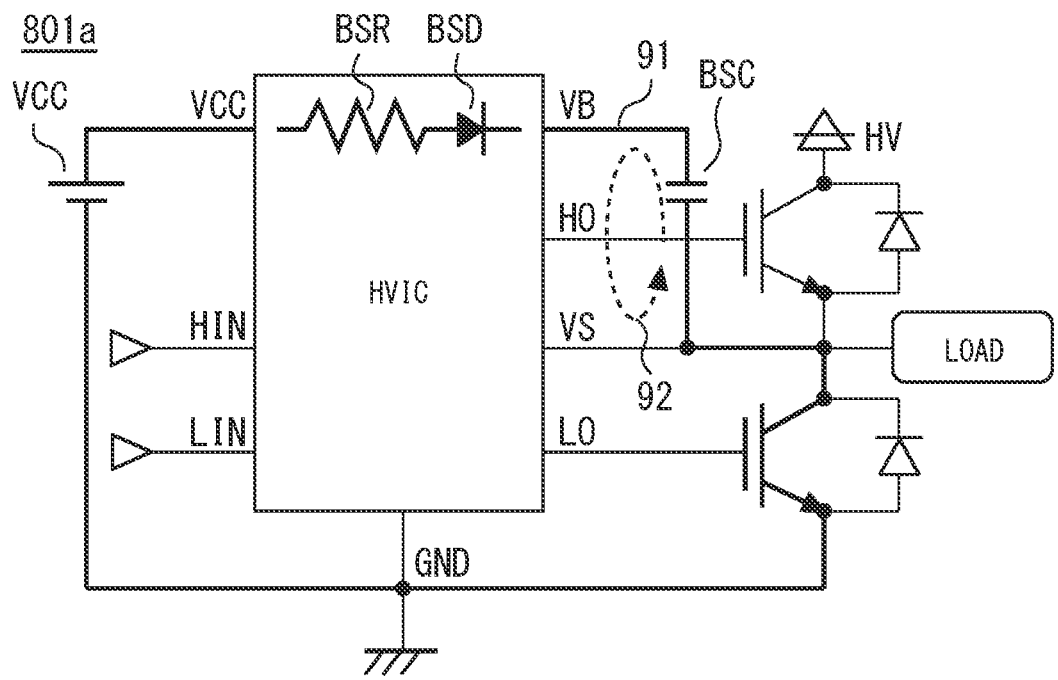

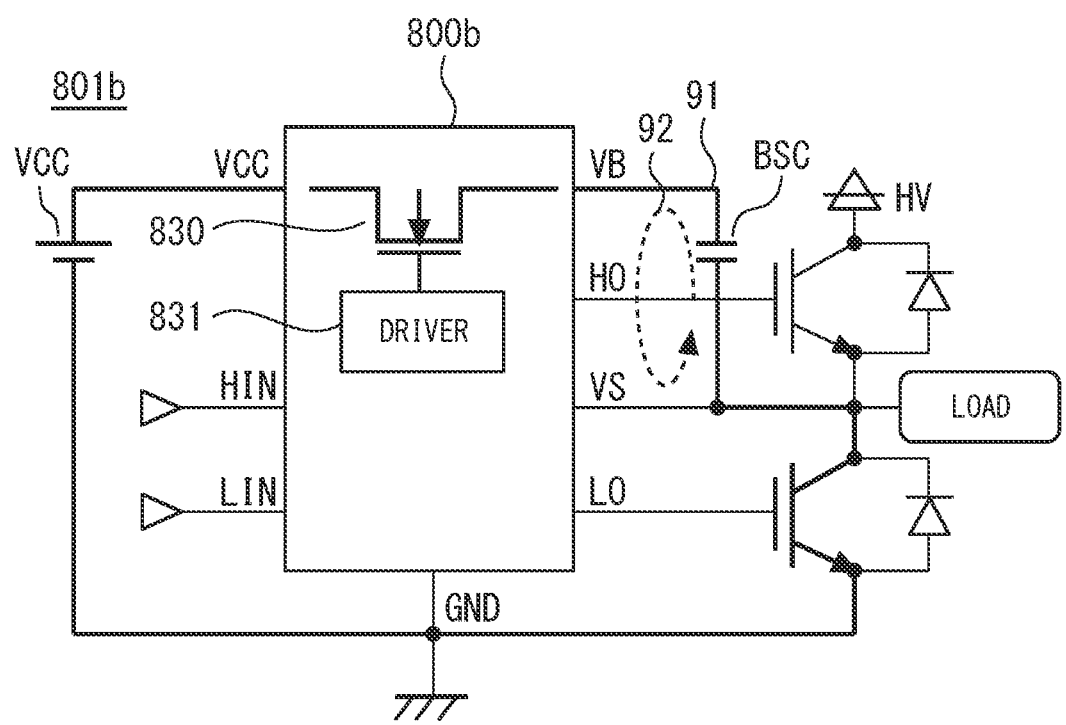
FIG.7 --Prior Art--

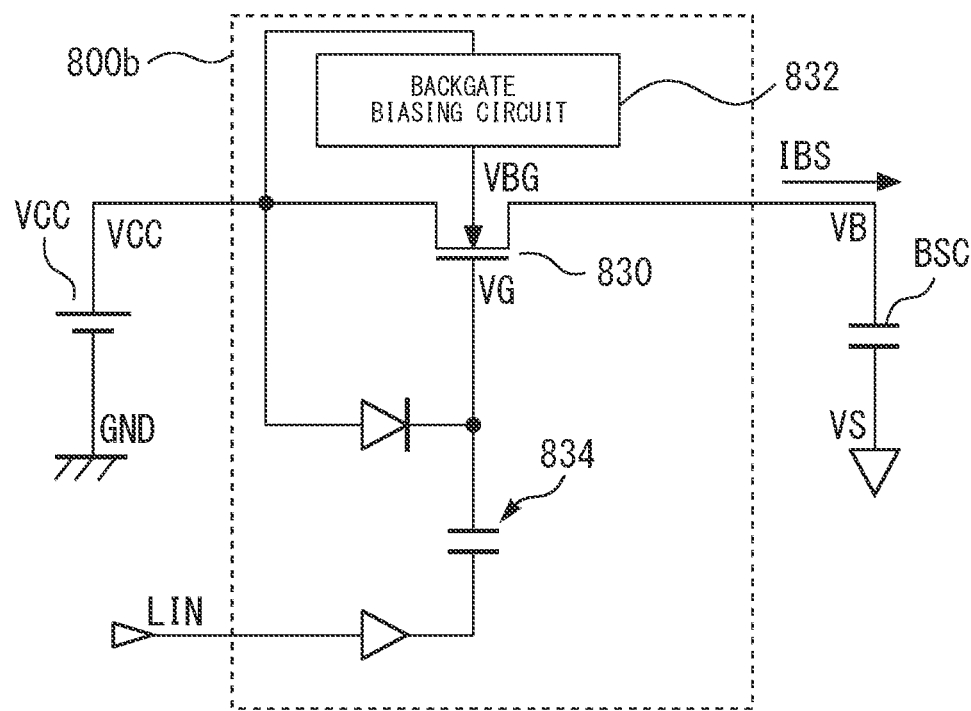
FIG.8 --Prior Art--
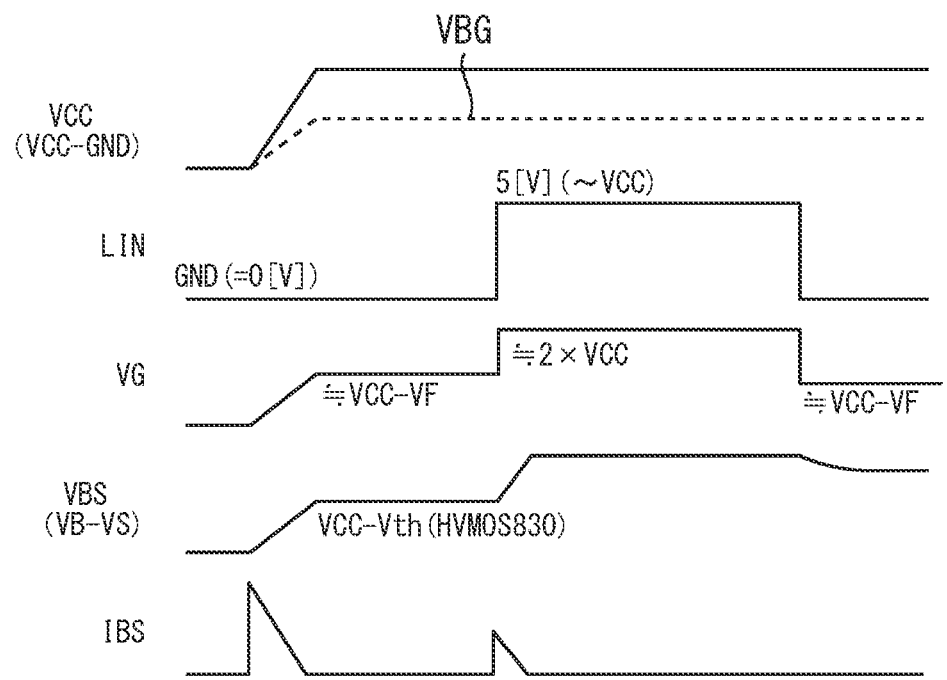
FIG.9 --Prior Art--

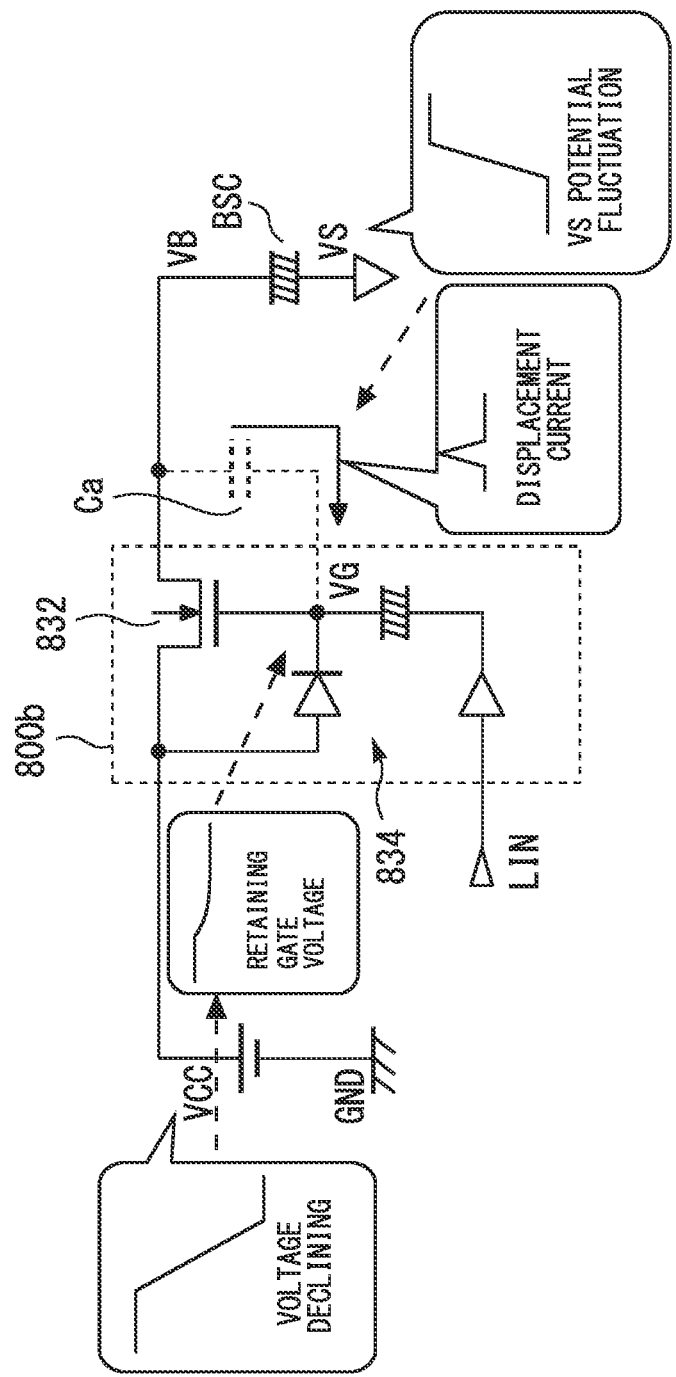
FIG.10 --Prior Art--

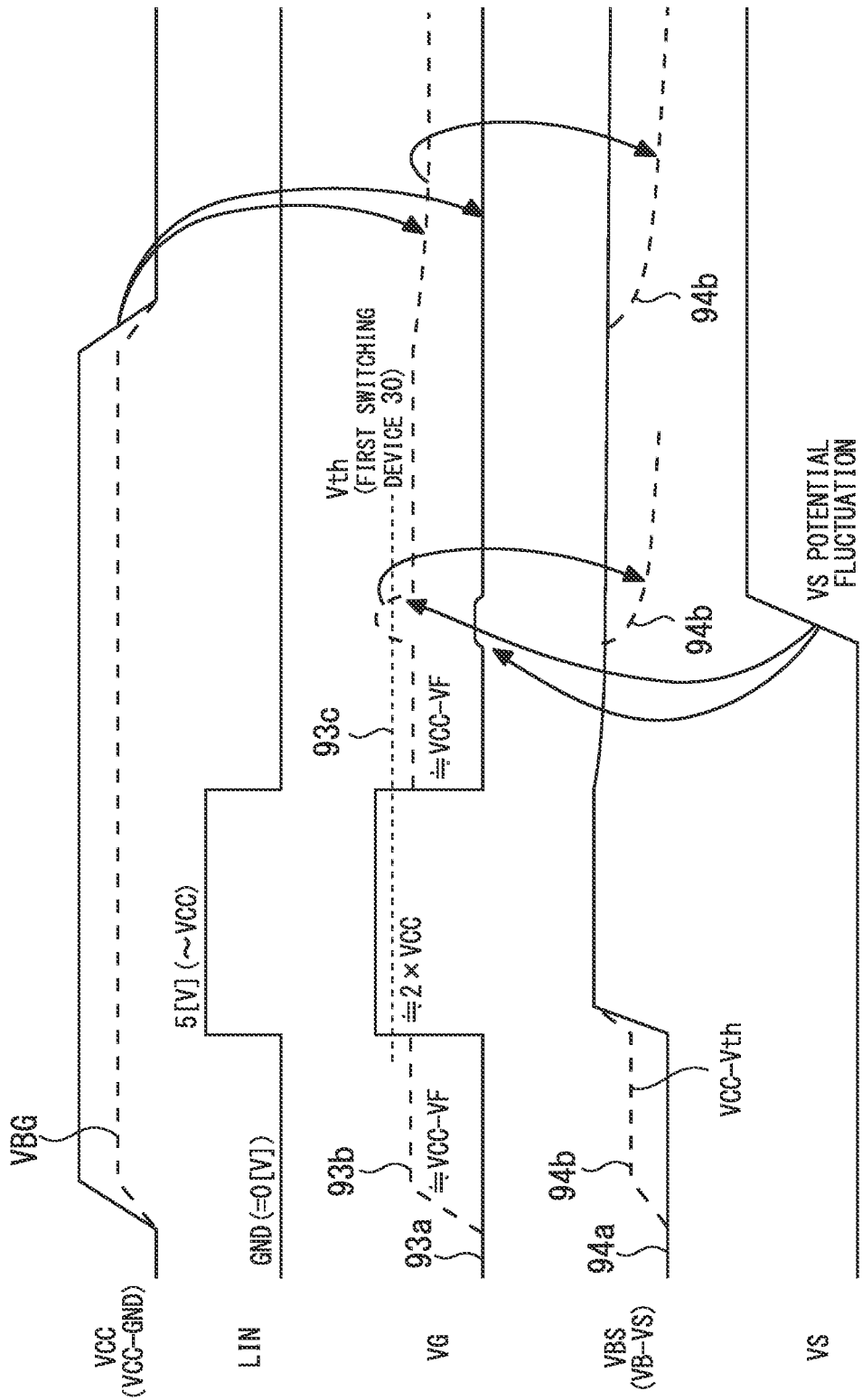

DRIVE CIRCUIT AND INVERTER DEVICE

BACKGROUND OF THE INVENTION

Field

The present disclosure relates to a drive circuit and an inverter device.

Background

JP 2007-513543 A discloses a bootstrap diode emulator circuit for use in a half-bridge switching circuit. The half-bridge switching circuit includes transistors connected to one another in a totem pole configuration at a load node, and a drive circuit for driving the transistors. In addition, the half-bridge switching circuit includes a bootstrap capacitor for supplying power to the drive circuit on a high voltage side.

The bootstrap diode emulator circuit includes an LDMOS transistor. The LDMOS transistor includes a gate, a backgate, a source and a drain. The drain of the LDMOS transistor is coupled to a high voltage side supply node, and the source is coupled to a low voltage side supply node. To the gate of the LDMOS transistor, a gate control circuit is electrically coupled. To the backgate of the LDMOS transistor, a dynamic backgate biasing circuit is electrically coupled. The dynamic backgate biasing circuit is operable to dynamically bias the backgate when an LDMOS is turned on by applying a voltage close to but slightly lower than a voltage of the drain of the LDMOS transistor to the backgate.

In JP 2007-513543 A, transition to an off state of the LDMOS transistor is achieved by turning an end-to-end voltage of the capacitor connected to the gate of the LDMOS transistor to 0 V. In this configuration, the capacitor needs to be charged from 0 V when shifting to an on state of the LDMOS transistor. Therefore, there is a risk that it takes time to shift to the on state.

SUMMARY

The present disclosure is implemented in order to solve the problem described above, and it is an object to provide a drive circuit and an inverter device capable of a high-speed operation.

The features and advantages of the present disclosure may be summarized as follows.

According to one aspect of the present disclosure, a drive circuit includes a first driver configured to control on/off of an upper arm of an inverter circuit, a second driver configured to control on/off of a lower arm of the inverter circuit, a first switching device including a first terminal, a second terminal and a control terminal configured to control on/off between the first terminal and the second terminal, the first terminal of which is connected with a power supply supplied to the first driver, and the second terminal of which is connected with a power supply supplied to the second driver, a booster circuit configured to turn on the first switching device by boosting a control signal which is at a high level when the lower arm is in an on state and is at a low level when the lower arm is in an off state and performing supply to the control terminal, a second switching device connected between the control terminal and the booster circuit, and configured to cause continuity between the control terminal and the booster circuit when the control signal is at the high level and cause interruption between the control terminal and the booster circuit when the control signal is at the low level, and first switch unit configured to cause interruption between the control terminal and a terminal for grounding when the control signal is at the high level and short-circuit the control terminal and the terminal for grounding when the control signal is at the low level, wherein a current flows from the power supply supplied to the second driver to the power supply supplied to the first driver when the first switching device is turned on, and the power supply supplied to the first driver is charged.

According to another aspect of the present disclosure, an inverter device includes an inverter circuit including an upper arm and a lower arm, a drive circuit and a first power supply connected between a connection point of the upper arm and the lower arm and the drive circuit, wherein the drive circuit includes a first driver configured to be supplied with the first power supply and control on/off of the upper arm, a second driver configured to be supplied with a second power supply and control on/off of the lower arm, a first switching device including a first terminal, a second terminal and a control terminal configured to control on/off between the first terminal and the second terminal, the first terminal of which is connected with the first power supply, and the second terminal of which is connected with the second power supply, a booster circuit configured to turn on the first switching device by boosting a control signal which is at a high level when the lower arm is in an on state and is at a low level when the lower arm is in an off state and performing supply to the control terminal, a second switching device connected between the control terminal and the booster circuit, and configured to cause continuity between the control terminal and the booster circuit when the control signal is at the high level and cause interruption between the control terminal and the booster circuit when the control signal is at the low level, and a first switch unit configured to cause interruption between the control terminal and a terminal for grounding when the control signal is at the high level and short-circuit the control terminal and the terminal for grounding when the control signal is at the low level, and a current flows from the second power supply to the first power supply when the first switching device is turned on, and the first power supply is charged.

Other and further objects, features and advantages of the disclosure will appear more fully from the following description.

BRIEF DESCRIPTION OF DRAWINGS

FIG. 5 is a diagram illustrating a configuration of an inverter device relating to a first comparative example.

FIG. 6 is a diagram illustrating a configuration of an inverter device relating to a second comparative example.

FIG. 7 is a diagram illustrating a configuration of an inverter device relating to a third comparative example.

FIG. 8 is a diagram illustrating a configuration of a drive circuit relating to the third comparative example.

FIG. 9 is a diagram illustrating a waveform of the inverter device relating to the third comparative example.

FIG. 10 is a diagram explaining an operation of the drive circuit relating to the third comparative example.

FIG. 11 is a diagram illustrating a waveform of the drive circuit relating to the first embodiment.

DESCRIPTION OF EMBODIMENTS

Figure 1:
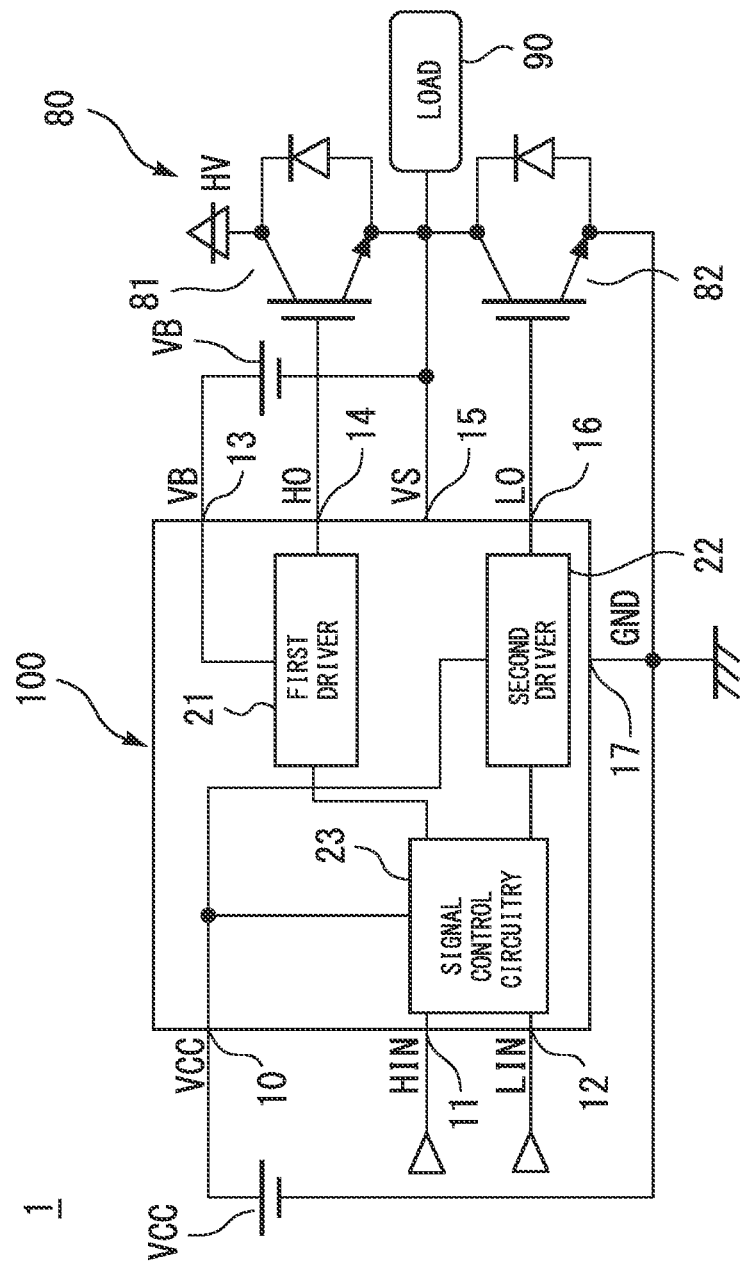
FIG. 1 is a diagram illustrating a configuration of an inverter device relating to the first embodiment.

Drive circuits and inverter devices according to embodiments of the present disclosure will be described with reference to the accompanying drawings. Components identical or corresponding to each other are indicated by the same reference characters, and repeated description of them is avoided in some cases.

First Embodiment

FIG. 1 is a diagram illustrating a configuration of an inverter device 1 relating to the first embodiment. The inverter device 1 includes an inverter circuit 80, a drive circuit 100, and a power supply VB.

The inverter circuit 80 includes an upper arm 81, and a lower arm 82 connected with the upper arm 81 in series. The upper arm 81 and the lower arm 82 each includes a switching device of an IGBT (Insulated Gate Bipolar Transistor) or the like and a freewheel diode. To a connection point of the upper arm 81 and the lower arm 82, a load 90 is connected.

The drive circuit 100 drives the inverter circuit 80. The drive circuit 100 is also referred to as an HVIC (High Voltage IC). The drive circuit 100 includes a first driver 21 which controls on/off of the upper arm 81, a second driver 22 which controls on/off of the lower arm 82, and a signal control circuitry 23.

Further, the drive circuit 100 includes a first power terminal 13 to which the power supply VB supplied to the first driver 21 is connected, and a second power terminal 10 to which a power supply VCC supplied to the second driver 22 is connected. In addition, the drive circuit 100 includes a power terminal 15 and a terminal for grounding 17. The power supply VB is connected between the connection point of the upper arm 81 and the lower arm 82 and the first power terminal 13. The power supply VCC is connected between the second power terminal 10 and the terminal for grounding 17. To the power terminal 15, a voltage VS at the connection point of the upper arm 81 and the lower arm 82 is inputted. The VS is a power supply reference on a high voltage side, and GND is a power supply reference on a low voltage side.

Further, the drive circuit 100 includes signal input terminals 11 and 12 and signal output terminals 14 and 16. To the signal input terminal 11, a high voltage side control signal HIN is inputted. To the signal input terminal 12, a low voltage side control signal LIN is inputted. To the signal output terminal 14, a control terminal for controlling the on/off of a switching device of the upper arm 81 is connected. To the signal output terminal 16, a control terminal for controlling the on/off of a switching device of the lower arm 82 is connected.

The first driver 21 receives the high voltage side control signal HIN via the signal control circuitry 23. The first driver 21 outputs a high voltage side output signal HO from the signal output terminal 14 according to the high voltage side control signal HIN, and controls the on/off of the upper arm 81. The second driver 22 receives the low voltage side control signal LIN via the signal control circuitry 23. The second driver 22 outputs a low voltage side output signal LO from the signal output terminal 16 according to the low voltage side control signal LIN, and controls the on/off of the lower arm 82.

Figure 2:
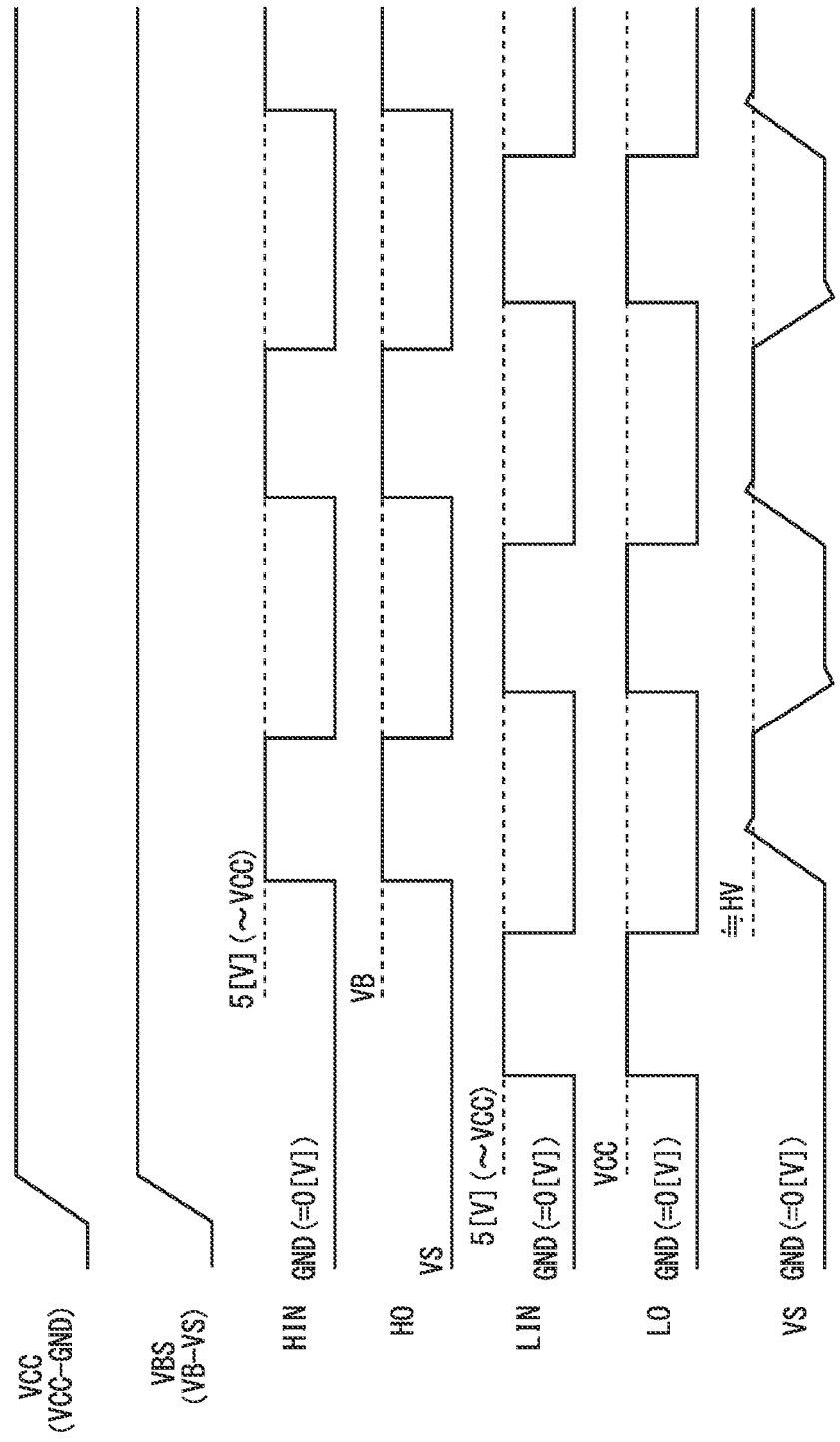
FIG. 2 is a diagram illustrating a waveform of the inverter device relating to the first embodiment.

FIG. 2 is a diagram illustrating a waveform of the inverter device 1 relating to the first embodiment. In the inverter circuit 80, the voltage VS rises to a load voltage HV when the upper arm 81 is driven. The power supply VB is provided in order to supply a voltage higher than the voltage VS to the control terminal of the upper arm 81.

Figure 3:
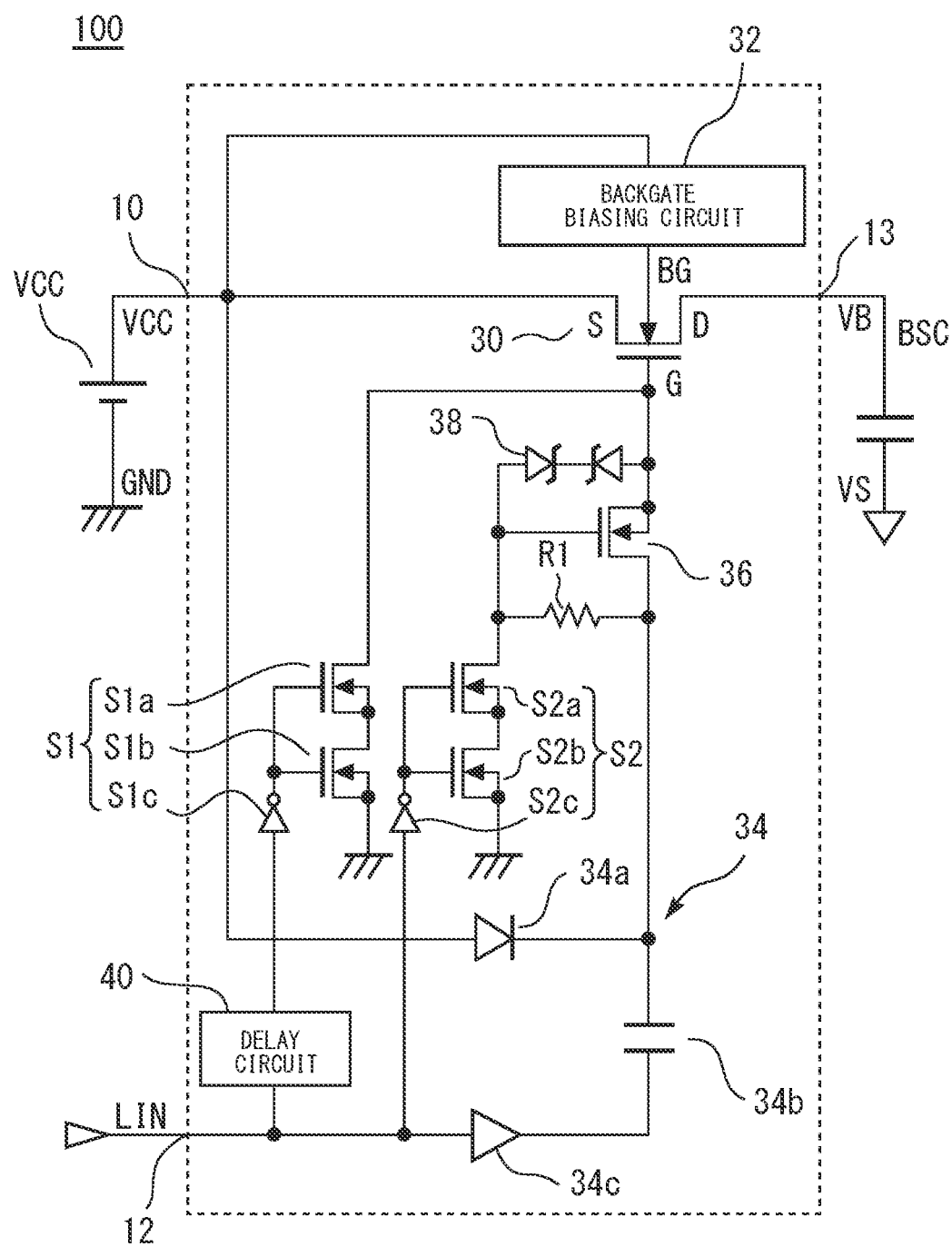
FIG. 3 is a diagram illustrating a configuration of the drive circuit relating to the first embodiment.

FIG. 3 is a diagram illustrating a configuration of the drive circuit 100 relating to the first embodiment. Here, a circuit for charging the power supply VB from the power supply VCC will be described. In FIG. 3, the first driver 21, the second driver 22 and the signal control circuitry 23 are omitted.

The drive circuit 100 includes a first switching device 30. The first switching device 30 is an HVMOS (High Voltage Metal-Oxide-Semiconductor) which substitutes a bootstrap diode and a bootstrap resistor. The first switching device 30 is also referred to as an emulation MOS.

The first switching device 30 includes a first terminal, a second terminal, and a control terminal which controls the on/off between the first terminal and the second terminal. In the first switching device 30, the first terminal is connected with the first power terminal 13, and the second terminal is connected with the second power terminal 10. The first switching device 30 is an LDMOS (Laterally Diffused MOS) transistor for which a backgate biasing circuit 32 is connected to a backgate for example. In a case where the first switching device 30 is an LDMOS transistor, the first terminal is a drain, the second terminal is a source, and the control terminal is a gate.

The drive circuit 100 includes a booster circuit 34. The booster circuit 34 includes a diode 34a, a capacitor 34b and a buffer 34c. The signal input terminal 12 is connected to one end of the capacitor 34b via the buffer 34c. The other end of the capacitor 34b is connected to a cathode of the diode 34a and a drain of a second switching device 36. An anode of the diode 34a is connected to the second power terminal 10. The booster circuit 34 turns on the first switching device 30 by boosting the low voltage side control signal LIN and performing supply to the control terminal of the first switching device 30.

To the control terminal of the first switching device 30, a first switch unit S1 is connected. The first switch unit S1 is configured from two switching devices S1a and S1b connected in series and an inverter S1c. One end of the first switch unit S1 is connected with the control terminal of the first switching device 30, and the other end is connected with a terminal for grounding. Gates of the switching devices S1a and S1b are connected with the signal input terminal 12 via the inverter S1c and a delay circuit 40. That is, the control terminal for switching the on/off of the first switch unit S1 is connected with the signal input terminal 12.

The first switch unit S1 causes interruption between the control terminal of the first switching device 30 and the terminal for grounding when the low voltage side control signal LIN is at a high level, and short-circuits the control terminal of the first switching device 30 and the terminal for grounding when the low voltage side control signal LIN is at a low level. In this way, the first switch unit S1 supplies 0 V to the control terminal of the first switching device 30.

Between the control terminal of the first switching device 30 and the booster circuit 34, the second switching device 36 is connected. The second switching device 36 is an NMOS for example. The source of the second switching device 36 is connected with the control terminal of the first switching device 30. The drain of the second switching device 36 is connected to the booster circuit 34. The gate of the second switching device 36 is connected to a second switch unit S2.

Between the source and the gate of the second switching device 36, a clamp circuit 38 configured from a Zener diode is connected. The clamp circuit 38 protects a gate-source voltage of the second switching device 36. Between the connection point of the booster circuit 34 and the second switching device 36 and the connection point of the second switch unit S2 and the second switching device 36, a limiting resistor R1 is connected.

The second switch unit S2 is configured from two switching devices S2a and S2b connected in series and an inverter S2c. One end of the second switch unit S2 is connected with the gate of the second switching device 36, and the other end is connected with the terminal for grounding. The gates of the switching devices S2a and S2b are connected with the signal input terminal 12 via the inverter S2c. That is, the control terminal for switching the on/off of the second switch unit S2 is connected with the signal input terminal 12.

The second switch unit S2 controls the second switching device 36. The second switch unit S2 is turned to an off state when the low voltage side control signal LIN is at the high level. Thus, the second switching device 36 is set to an on state. In addition, the second switch unit S2 is turned to the on state when the low voltage side control signal LIN is at the low level. Thus, the second switching device 36 is set to the off state.

In this way, the second switching device 36 is turned to the on state when the low voltage side control signal LIN is at the high level, and causes continuity between the control terminal of the first switching device 30 and the booster circuit 34. In addition, the second switching device 36 is turned to the off state when the low voltage side control signal LIN is at the low level, and causes interruption between the control terminal of the first switching device 30 and the booster circuit 34.

The delay circuit 40 delays an operation according to the low voltage side control signal LIN of the first switch unit S1 relative to an operation according to the low voltage side control signal LIN of the second switching device 36. By the delay circuit 40, the first switch unit S1 can be operated after the second switch unit S2 is operated.

Figure 4:
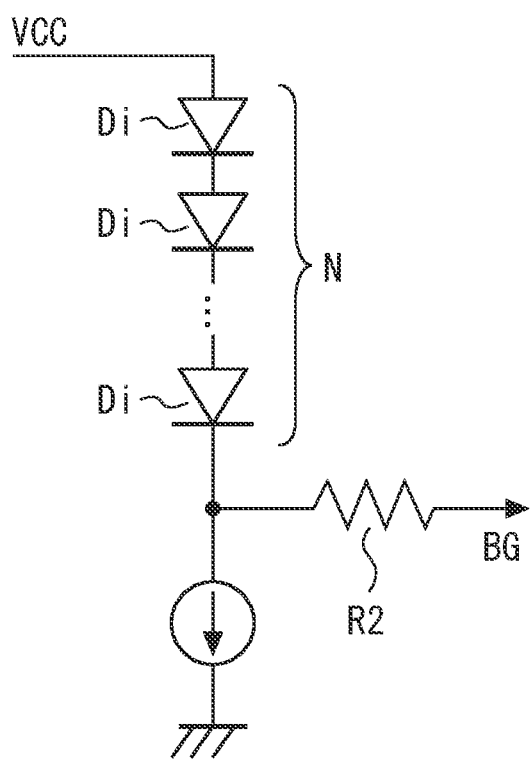
FIG. 4 is a diagram explaining a configuration of the backgate biasing circuit relating to the first embodiment.

FIG. 4 is a diagram explaining a configuration of the backgate biasing circuit 32 relating to the first embodiment. The backgate biasing circuit 32 is provided for withstand voltage protection and suppression of a parasitic operation in the LDMOS transistor. In the backgate biasing circuit 32, a plurality of diodes Di's are connected in series. An anode side of the plurality of diodes Di's is connected to the power supply VCC. A cathode side of the plurality of diodes Di's is connected to the backgate of the first switching device 30 via a resistor R2.

A bias value of the backgate biasing circuit 32 is set by adjusting a potential difference from the power supply VCC by a forward voltage VF according to a step number of the diodes Di's. The bias value is determined from a threshold voltage Vth of the first switching device 30 for example. The bias value is determined so as to be equal to or smaller than a withstand voltage of a diode between the backgate and the source of the first switching device 30.

Here, when a drain voltage of the first switching device 30 is lower than a backgate voltage, a current flows from the backgate to the power supply VB via a diode between the backgate and the drain. When a recovery current flows in the diode between the backgate and the drain, it becomes a cause of surge occurrence. Therefore, it is better to lower a backgate potential in a GND direction within the withstand voltage of the diode between the backgate and the source. However, when the backgate potential is lowered, a backgate biasing effect tends to become large. Therefore, attention needs to be paid to a Vth fluctuation of the LDMOS.

In the drive circuit 100, the first switching device 30 is driven by the booster circuit 34. In the booster circuit 34, electric charges are accumulated in the capacitor 34b from the power supply VCC when the low voltage side control signal LIN is at the low level. When the low voltage side control signal LIN is at the high level, the voltage of the capacitor 34b is boosted by the buffer 34c, and the booster circuit 34 turns on the first switching device 30. When the first switching device 30 is turned on, the current flows from the second power terminal 10 to the first power terminal 13, and the power supply VB to be supplied to the first driver is charged. In addition, by the diode 34a, the current can be prevented from flowing back to the power supply VCC during a boosting operation. The power supply VB is configured from a capacitor BSC. The capacitor BSC is also referred to as a bootstrap capacitor.

FIG. 5 is a diagram illustrating a configuration of an inverter device 801 relating to a first comparative example. As a method of configuring the power supply VB, there are generally a floating power supply system and a bootstrap power supply system. In the case where current consumption of the power supply VB is small, an inexpensive bootstrap power supply system is often adopted. The case where the current consumption of the power supply VB is small is the case where the load is only the gate of a power transistor in a small capacity band inverter system for example. In the inverter device 801 relating to the first comparative example, the power supply VB is charged by the bootstrap power supply system.

In the inverter device 801, the power supply VCC and the power supply VB are connected by a diode BSD and a resistor BSR. At the time, when a VB voltage is lower than a VCC voltage such as the case where an N side IGBT is on, charging is executed via a route illustrated by a solid line 91. In addition, when a P side IGBT is on, the current flows via a route illustrated by a broken line 92.

In this configuration, an area for adding the diode BSD and the resistor BSR is needed. In addition, there is a risk of breakdown occurrence due to the recovery current generated when the diode BSD is biased from a forward direction to a reverse direction.

FIG. 6 is a diagram illustrating a configuration of an inverter device 801a relating to a second comparative example. In the inverter device 801a, the diode BSD and the resistor BSR are built in the HVIC. Even in this case, there is the risk of the breakdown occurrence due to the recovery current. In addition, there is the risk that charging efficiency declines due to a parasitic element when charging the capacitor BSC.

FIG. 7 is a diagram illustrating a configuration of an inverter device 801b relating to a third comparative example. FIG. 8 is a diagram illustrating a configuration of a drive circuit 800b relating to the third comparative example. In the inverter device 801b, a function of the diode BSD is substituted by an HVMOS 830 built in the drive circuit 800b. The HVMOS 830 is an LDMOS transistor for example. The drain of the HVMOS 830 is connected to the power supply VB, and the source is connected to the power supply VCC. In addition, the drive circuit 800b includes a driver 831 and a backgate biasing circuit 832. The driver 831 includes a booster circuit 834 for biasing the LDMOS transistor in a triode region when charging the capacitor BSC.

FIG. 9 is a diagram illustrating a waveform of the inverter device 801b relating to the third comparative example. When the low voltage side control signal LIN is at the low level, the electric charges are accumulated in the capacitor of the booster circuit 834 from the power supply VCC. At the time, a gate voltage VG of the HVMOS 830 becomes VCC-VF. Here, the VF is the forward voltage of the diode of the booster circuit 834. Since the VF is smaller than the VCC, it is VCC≈VG. In addition, a voltage VBS at the time is VCC-Vth. Here, the voltage VBS is an end-to-end voltage of the capacitor BSC, and the Vth is a threshold voltage of the HVMOS 830.

When the low voltage side control signal LIN is at the high level, the voltage of the capacitor of the booster circuit 834 is boosted by a buffer, and the HVMOS 830 is turned on. At the time, the gate voltage VG of the HVMOS 830 becomes 2×VCC for example. In addition, by a current IBS, the capacitor BSC is charged.

When the low voltage side control signal LIN becomes the low level again, the voltage of the capacitor of the booster circuit 834 declines according to output of the buffer. In the case where the power supply VB is charged, the source voltage, the gate voltage and the drain voltage of the HVMOS 830 become VCC≈VG≈VB. At the time, a gate-source voltage VGS of the HVMOS 830 is not secured. Thus, the HVMOS 830 is turned to the off state.

In this way, in the system of setting individual nodes of the HVMOS 830 to VCC≈VG≈VB, when the power supply VB is not charged, the HVMOS 830 is turned to the on state and a charging current flows. When the low voltage side control signal LIN is at the low level, a boundary point of the on/off of the HVMOS 830 is VB potential=VCC-Vth. Here, the Vth is the threshold voltage of the HVMOS 830. At the time, the backgate potential is set within the withstand voltage of the diode between the backgate and the source and in a range equal to or lower than VCC-Vth. Thus, in the drive circuit 800b, the backgate potential is set at VCC-Vth.

FIG. 10 is a diagram explaining an operation of the drive circuit 800b relating to the third comparative example. In the drive circuit 800b, the gate of the HVMOS 830 is HiZ. Therefore, the gate voltage is retained at all times. At the time, even in the case where the voltage of the power supply VCC declines, the gate voltage is retained. Thus, the gate-source voltage VGS of the HVMOS 830 corresponding to VG-VCC is secured, and there is the risk that a reverse current mode from the power supply VB to the power supply VCC occurs.

In addition, when a VS potential fluctuation occurs when driving the inverter, there is a possibility that a displacement current flows into the gate via a parasitic capacitor Ca between the drain and the gate of the HVMOS 830. Thus, there is the risk that the gate voltage VG rises and the HVMOS 830 malfunctions or is erroneously turned on. At the time, there is the risk that the reverse current mode occurs.

FIG. 11 is a diagram illustrating a waveform of the drive circuit 100 relating to the first embodiment. In the present embodiment, the first switching device 30 is turned off by supply of 0 V to the control terminal. Thus, off logic independent of the VCC and the VB can be configured.

When the low voltage side control signal LIN is at the low level, the first switch unit S1 and the second switch unit S2 are in a short circuit state. At the time, the gate-source voltage VGS of the second switching device 36 is 0 V. Thus, the second switching device 36 is turned to the off state, and interruption between the capacitor 34b of the booster circuit 34 and the control terminal of the first switching device 30 is caused.

When the low voltage side control signal LIN is at the high level, the first switch unit S1 and the second switch unit S2 are in an open state. At the time, a gate-drain voltage VGD of the second switching device 36 is VCC-VF. Here, the VF is the forward voltage of the diode 34a. Thus, the second switching device 36 is turned to the on state. Thus, the capacitor 34b of the booster circuit 34 and the control terminal of the first switching device 30 are connected. In addition, since the first switch unit S1 is in the open state, a boosting voltage is supplied to the first switching device 30 by the booster circuit 34.

In FIG. 11, the voltage VG of the control terminal of the first switching device 30 is illustrated as a solid line 93a. In addition, the gate voltage VG of the HVMOS 830 in the inverter device 801b is illustrated by a broken line 93b as the comparative example. Further, the voltage VBS of the present embodiment is illustrated by the solid line 94a. Also, the voltage VBS of the inverter device 801b is illustrated by a broken line 94b as the comparative example.

In the inverter device 801b relating to the comparative example, a difference between the gate voltage when the HVMOS 830 is in the off state and the Vth of the HVMOS 830 is small. Therefore, in the case where the VS potential fluctuation occurs, there is the risk that the HVMOS 830 is erroneously turned on. Thus, there is the risk that the reverse current mode occurs and the voltage VBS declines as illustrated by the broken line 94b.

In contrast, in the present embodiment, when the first switching device 30 is in the off state, the voltage VG of the control terminal is 0 V. Therefore, the voltage VG has a sufficient margin to the Vth of the first switching device 30 illustrated by a broken line 93c. Thus, even in the case where the displacement current flows into the control terminal due to the VS potential fluctuation, erroneous turn-on of the first switching device 30 can be suppressed. Thus, the reverse current mode can be suppressed.

In addition, in the inverter device 801b relating to the comparative example, the gate of the HVMOS 830 is HiZ, and the gate voltage VG is retained even when the voltage of the power supply VCC declines. Thus, there is the risk that the reverse current mode occurs and the voltage VBS declines as illustrated by the broken line 94b.

In contrast, in the present embodiment, when the first switching device 30 is in the off state, the voltage VG of the control terminal is 0 V. Therefore, the rise of the VGS of the first switching device 30 can be suppressed and occurrence of the reverse current mode can be suppressed.

Further, by providing the second switching device 36, the first switching device 30 can be turned off in the state where the electric charges are accumulated in the booster circuit 34. Therefore, it is not needed to charge the capacitor 34b from 0 V when shifting to the on state. Thus, transition to the on state of the first switching device 30 can be accelerated, and a high-speed operation of the drive circuit 100 is made possible.

In addition, in the case that the second switch unit S2 is not provided in a gate sink transistor for example, the control terminal of the first switching device 30 is set at 0 V by the first switch unit S1. At the time, an excessive waste current is generated from the power supply VCC via the diode 34a. In order to avoid the excessive waste current, it is conceivable to insert a resistor between the control terminal of the first switching device 30 and the drain terminal of the first switch unit S1 and suppress the waste current. However, in the configuration, there is the risk that a high-speed off operation is obstructed by a time constant between a gate capacitor of the first switching device 30 and the inserted resistor when turning off the first switching device 30.

In contrast, in the present embodiment, interruption between the booster circuit 34 and the control terminal of the first switching device 30 is caused by the second switching device 36 and the second switch unit S2. Thus, flow of the waste current in the first switch unit S1 can be suppressed. In addition, by the limiting resistor R1, an overcurrent flowing to the second switch unit S2 when the second switch unit S2 is in the on state can be suppressed. Thus, the high-speed off operation can be achieved while suppressing the waste current.

In the present embodiment, the booster circuit 34 turns on the first switching device 30 by boosting a control signal and supplying the control signal to the control terminal of the first switching device 30. The second switching device 36 is turned to the on state when the control signal is at the high level, and causes continuity between the control terminal of the first switching device 30 and the booster circuit 34. In addition, the second switching device 36 is turned to the off state when the control signal is at the low level, and causes interruption between the control terminal of the first switching device 30 and the booster circuit 34. Further, the first switch unit S1 causes interruption between the control terminal of the first switching device 30 and the terminal for grounding when the control signal is at the high level. Furthermore, the first switch unit S1 short-circuits the control terminal of the first switching device 30 and the terminal for grounding when the control signal is at the low level. The control signal is the signal synchronized with the low voltage side control signal LIN in the present embodiment. Without being limited thereto, it is sufficient when the control signal is at the high level when the lower arm 82 is in the on state and is at the low level when the lower arm 82 is in the off state.

In addition, at least one of the upper arm 81 and the lower arm 82 may be made with a wide bandgap semiconductor. The wide bandgap semiconductor is silicon carbide, a gallium-nitride-based material or diamond for example. According to the present embodiment, the high-speed operation of the drive circuit 100 is possible. Therefore, even in the case where the inverter circuit 80 is formed of the wide bandgap semiconductor, the performance can be effectively utilized.

Further, in the present embodiment, the drive circuit 100 drives the IGBT. Without being limited thereto, the drive circuit 100 may drive a MOSFET (Metal-Oxide-Semiconductor Field-Effect Transistor).

In the inverter device 1, the drive circuit 100 drives a half-bridge circuit. Without being limited thereto, the drive circuit 100 may drive a full-bridge circuit or a three-phase inverter circuit.

Figure 12:
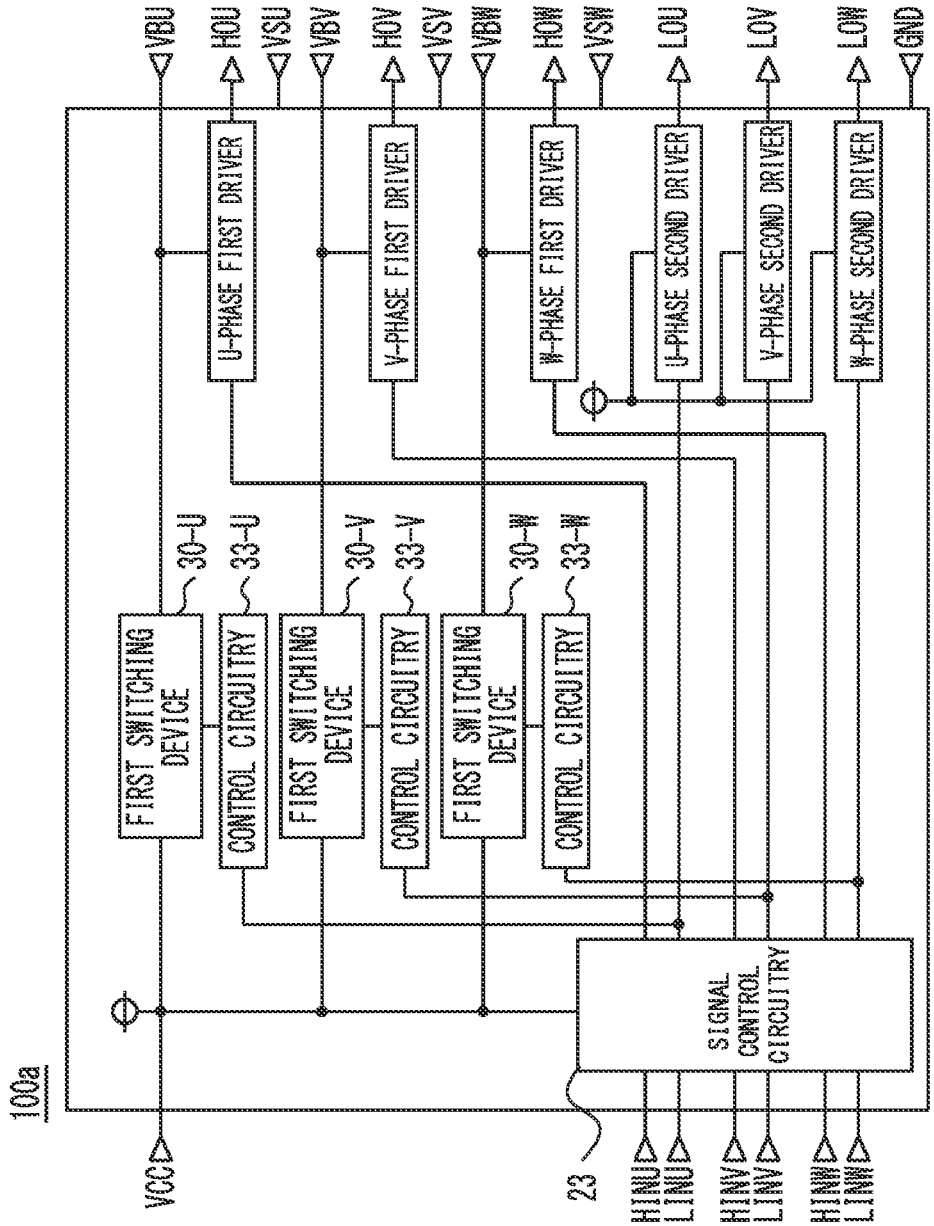
FIG. 12 is a diagram illustrating a configuration of a drive circuit relating to a modification of the first embodiment.

FIG. 12 is a diagram illustrating a configuration of a drive circuit 100a relating to a modification of the first embodiment. The drive circuit 100a drives a three-phase inverter circuit. The drive circuit 100a includes a U phase first driver, a V phase first driver and a W phase first driver which drive the upper arm of a U phase, a V phase and a W phase. In addition, the drive circuit 100a includes a U phase second driver, a V phase second driver and a W phase second driver that drive the lower arm of the U phase, the V phase and the W phase. The U phase first driver, the V phase first driver, the W phase first driver, the U phase second driver, the V phase second driver and the W phase second driver control the on/off of the corresponding arm according to the signal from the signal control circuitry 23.

To the signal control circuitry 23 and the U phase second driver, the V phase second driver and the W phase second driver, the power supply VCC is supplied. To the U phase first driver, the V phase first driver and the W phase first driver, a power supply VBU, a power supply VBV and a power supply VBW are supplied respectively.

The drive circuit 100a includes first switching devices 30_U, 30_V and 30_W for charging the power supply VBU, the power supply VBV and the power supply VBW. The first switching devices 30_U, 30_V and 30_W are controlled by control circuitries 33_U, 33_V and 33_W respectively. Each of the control circuitries 33_U, 33_V and 33_W includes the booster circuit 34, the second switching device 36, the first switch unit S1 and the second switch unit S2 illustrated in FIG. 3. In this way, in the case of driving the full-bridge circuit or the three-phase inverter circuit, the first switching device and the control circuitry are provided for each upper arm.

These modifications can be appropriately applied to drive circuits and inverter devices according to embodiments below. Meanwhile, for the drive circuits and the inverter devices according to the embodiments below, dissimilarities with the first embodiment will mainly be explained as they have many similarities with the first embodiment.

Second Embodiment

Figure 13:
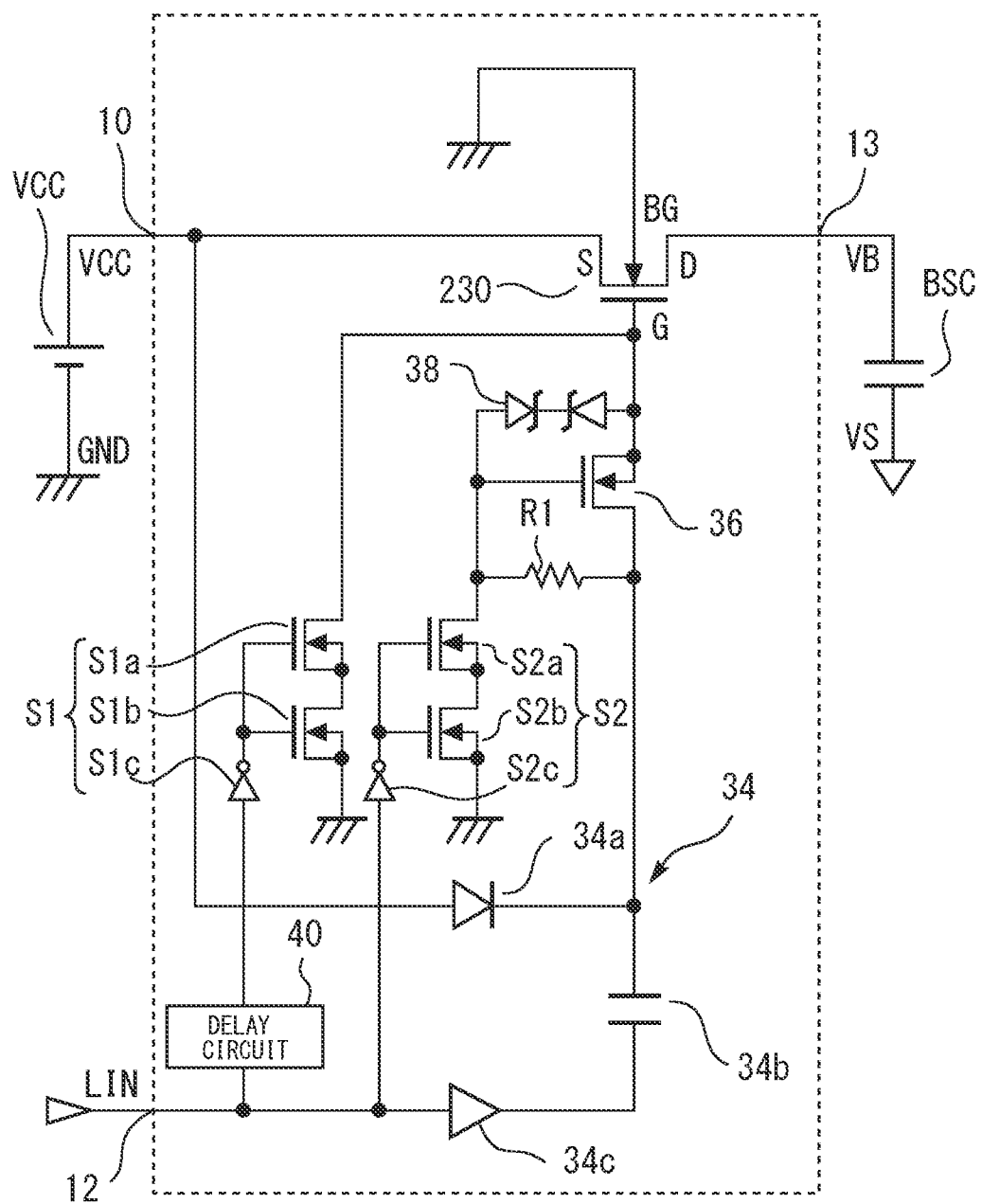
FIG. 13 is a diagram illustrating a configuration of a drive circuit relating to the second embodiment.

FIG. 13 is a diagram illustrating a configuration of a drive circuit 200 relating to the second embodiment. In the present embodiment, the configuration of a first switching device 230 is different from the configuration of the first switching device 30 of the first embodiment. For the first switching device 230, the backgate is connected with the terminal for grounding. The first switching device 230 is a WellMOS transistor.

Figure 14:
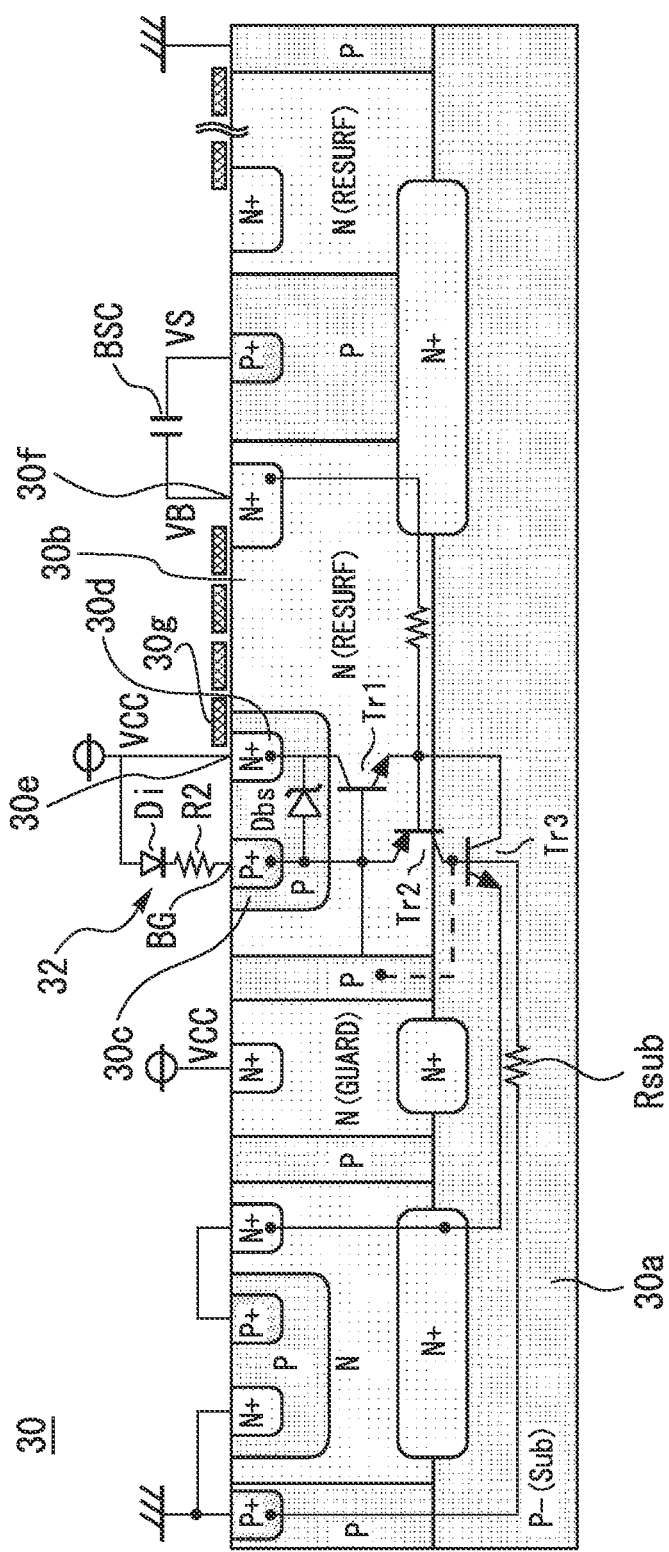
FIG. 14 is a sectional view of the first switching device which is the LDMOS transistor.

Here, a problem in the case of using the LDMOS transistor as the first switching device 30 will be described. FIG. 14 is a sectional view of the first switching device 30 which is the LDMOS transistor. The first switching device 30 includes a semiconductor layer 30a of a first conductivity type, and a first semiconductor region 30b of a second conductivity type which is electrically connected with a first terminal 30f of the first switching device 30 and formed on a surface of the semiconductor layer 30a. Here, the first conductivity type is a P type and the second conductivity type is an N type. Without being limited thereto, the first conductivity type may be the N type and the second conductivity type may be the P type.

On the surface of the first semiconductor region 30b, a second semiconductor region 30c of the first conductivity type electrically connected with the backgate is formed. On the surface of the second semiconductor region 30c, a third semiconductor region 30d of the second conductivity type electrically connected with a second terminal 30e of the first switching device is formed. In addition, a control terminal 30g of the first switching device 30 is connected via a gate insulating film to a channel region between the third semiconductor region 30d and the first semiconductor region 30b.

As illustrated in FIG. 14, in the LDMOS transistor, parasitic transistors Tr1, Tr2 and Tr3 exist. In the case where a VS negative surge generated when the inverter is driven is large, the parasitic transistors Tr2 and Tr3 become origins and a thyristor is configured in the LDMOS transistor and the peripheral circuit. When the thyristor is operated, latch-up may occur and there is the possibility that breakdown occurs depending on a current amount.

In the LDMOS transistor, in order to suppress the operation of the parasitic transistors, it is preferable to strongly fix the potential of island separation of the P type very close to the LDMOS transistor at a GND potential. Therefore, inflow of the current to a resistor Rsub can be suppressed. Thus, VBE of the parasitic transistor Tr3 to be the origin of the thyristor can be suppressed.

Figure 15:
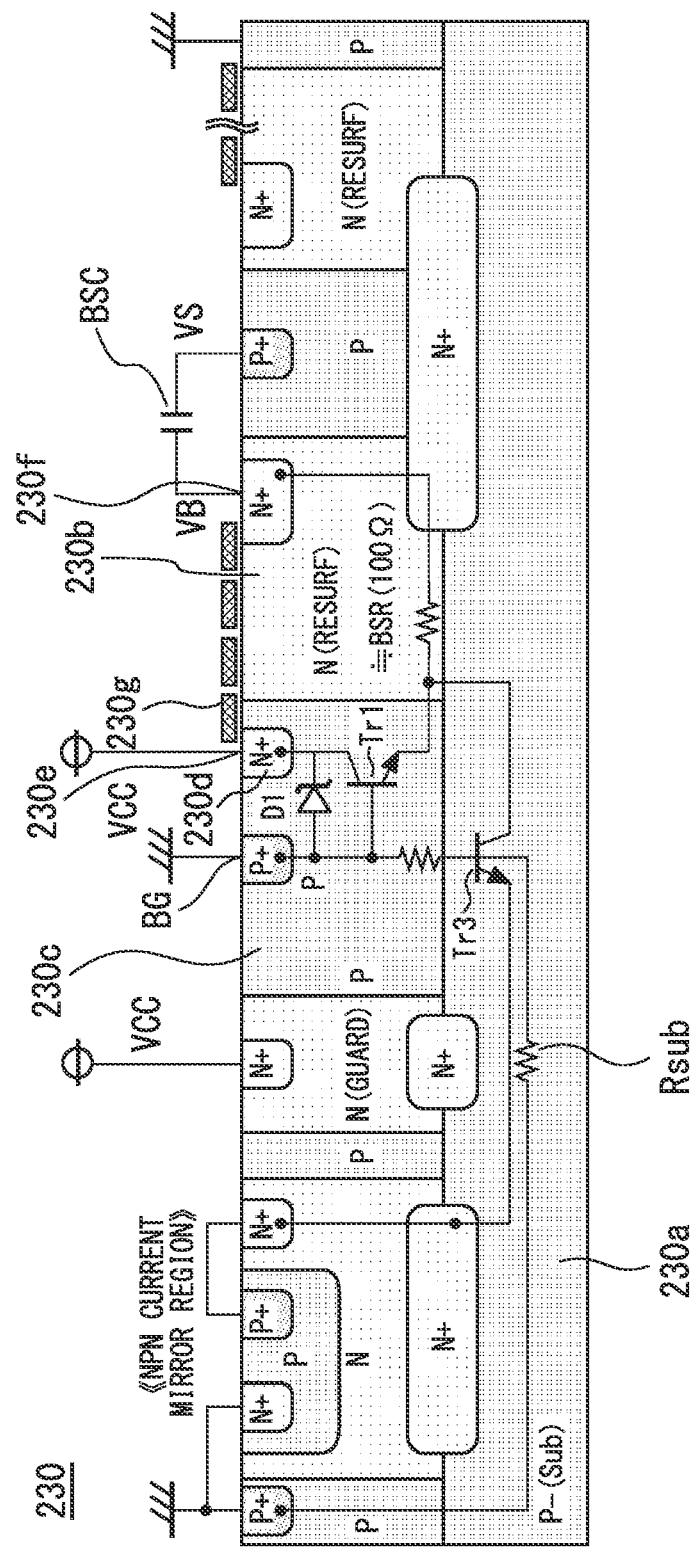
FIG. 15 is a sectional view of the first switching device relating to the second embodiment.

FIG. 15 is a sectional view of the first switching device 230 relating to the second embodiment. The first switching device 230 includes a semiconductor layer 230a of the first conductivity type, and a first semiconductor region 230b of the second conductivity type which is electrically connected with a first terminal 230f and formed on the surface of the semiconductor layer 230a. On the surface of the semiconductor layer 230a, a second semiconductor region 230c of the first conductivity type is formed adjacently to the first semiconductor region 230b. On the surface of the second semiconductor region 230c, a third semiconductor region 230d of the second conductivity type electrically connected with the second terminal 230e is formed. To a region separated from the third semiconductor region 230d in the second semiconductor region 230c, a backgate electrode BG electrically connected with the terminal for grounding is electrically connected. A control terminal 230g of the first switching device 230 is connected via the gate insulating film to the channel region between the third semiconductor region 230d and the first semiconductor region 230b. The withstand voltage between the second terminal 230e and the backgate electrode BG of the first switching device 230 is larger than the voltage of the power supply VCC supplied to the second driver 22.

A withstand voltage between the backgate and the source of the WellMOS transistor is sufficiently higher compared to the withstand voltage between the backgate and the source of the LDMOS transistor. Therefore, the need of control by the backgate biasing circuit is eliminated, and the backgate can be connected with the terminal for grounding. Thus, the drive circuit 200 can be miniaturized.

The potential of the backgate of the first switching device 230 is the GND potential, and is equal to the potential of a substrate. Therefore, in the first switching device 230, the parasitic transistor Tr2 to be the origin of thyristor generation does not exist. Thus, in the case that the VS negative surge is generated, occurrence of the latch-up can be suppressed. Thus, malfunctions and the breakdown can be suppressed.

Note that the present configuration can be adopted in the case where a maximum value of a potential difference between the voltage of the control terminal of the first switching device 230 and the terminal for grounding after boosting is equal to or smaller than the withstand voltage between the control-terminal and the backgate of the first switching device 230. The withstand voltage between the control-terminal and the backgate is pertinent to the withstand voltage of a gate oxide film.

Third Embodiment

Figure 16:
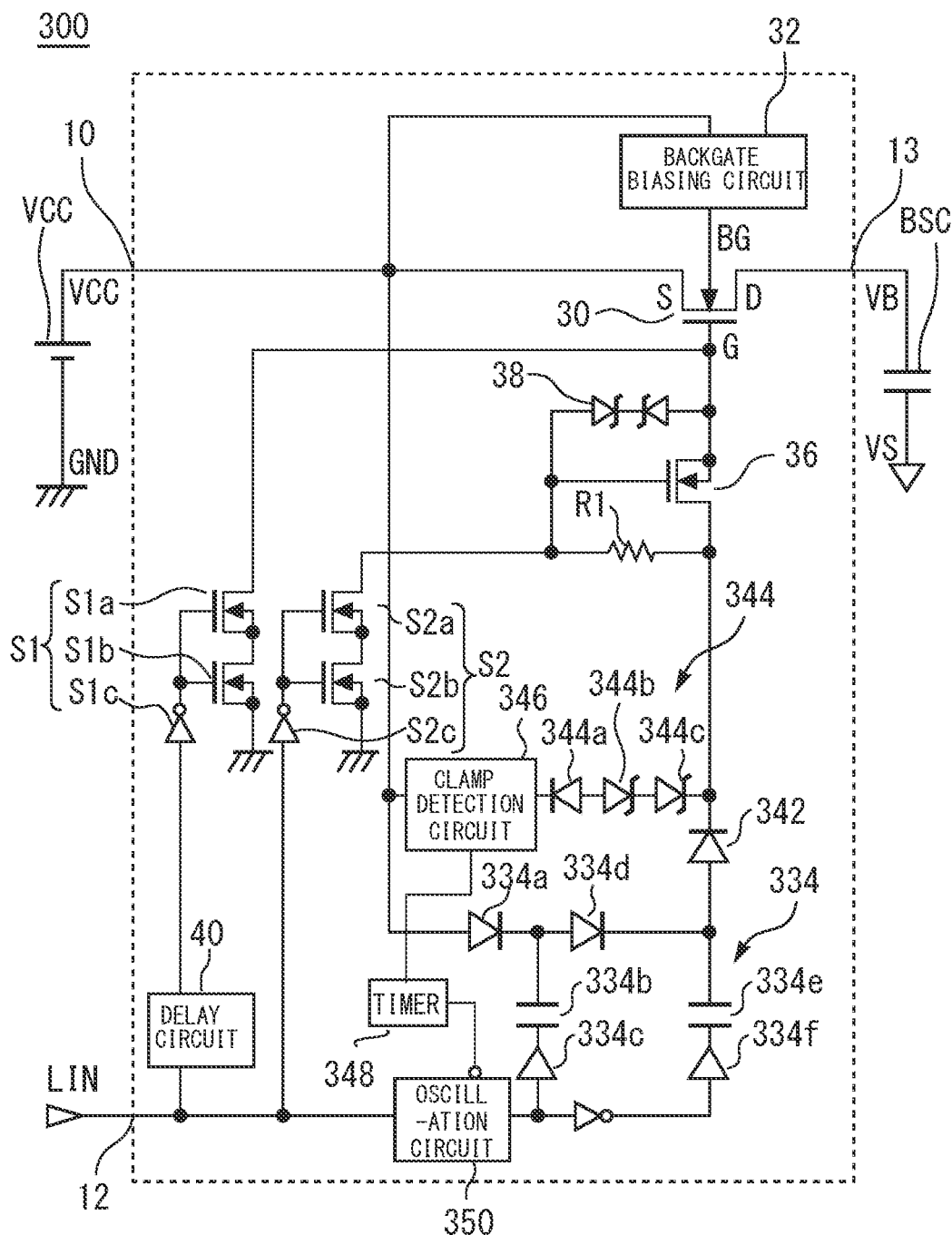
FIG. 16 is a diagram illustrating a configuration of a drive circuit relating to the third embodiment.

FIG. 16 is a diagram illustrating a configuration of a drive circuit 300 relating to the third embodiment. In the present embodiment, the configuration of a booster circuit 334 is different from the first embodiment. The drive circuit 300 includes an oscillation circuit 350, a clamp circuit 344, a clamp detection circuit 346 and a timer circuit 348. The oscillation circuit 350 outputs an oscillation waveform with the high level of the low voltage side control signal LIN as an enable signal.

To the output of the oscillation circuit 350, the booster circuit 334 is connected. The booster circuit 334 includes a first booster circuit, and a second booster circuit which boosts the signal of a phase opposite to that of the first booster circuit. The first booster circuit includes a diode 334a, a capacitor 334b, and a buffer 334c. The second booster circuit includes a diode 334d, a capacitor 334e, and a buffer 334f. To the buffer 334f, the signal of the phase opposite to that of the buffer 334c is inputted. The booster circuit 334 is operated by a charge pump system.

To the output of the booster circuit 334, the clamp circuit 344 and the second switching device 36 are connected via a diode 342. The clamp circuit 344 includes a diode 344a and Zener diodes 344b and 344c. The clamp circuit 344 controls the voltage supplied from the booster circuit 334 to the control terminal of the first switching device 30 to be equal to or lower than a predetermined threshold voltage. In addition, to the clamp circuit 344, the clamp detection circuit 346 which detects that the voltage supplied from the booster circuit 334 to the control terminal of the first switching device 30 has reached the threshold voltage is added.

When the clamp detection circuit 346 detects a voltage clamp, the timer circuit 348 is activated. When the clamp detection circuit 346 detects that the voltage supplied from the booster circuit 334 to the control terminal of the first switching device 30 has reached the threshold voltage, the timer circuit 348 stops the boosting operation of the booster circuit 334 for predetermined time. The output of the timer circuit 348 is connected to the oscillation circuit 350. When the clamp detection circuit 346 detects the voltage clamp, the timer circuit 348 stops the oscillation circuit 350 for the predetermined time. When the predetermined time elapses, the boosting operation is restarted.

Figure 17:
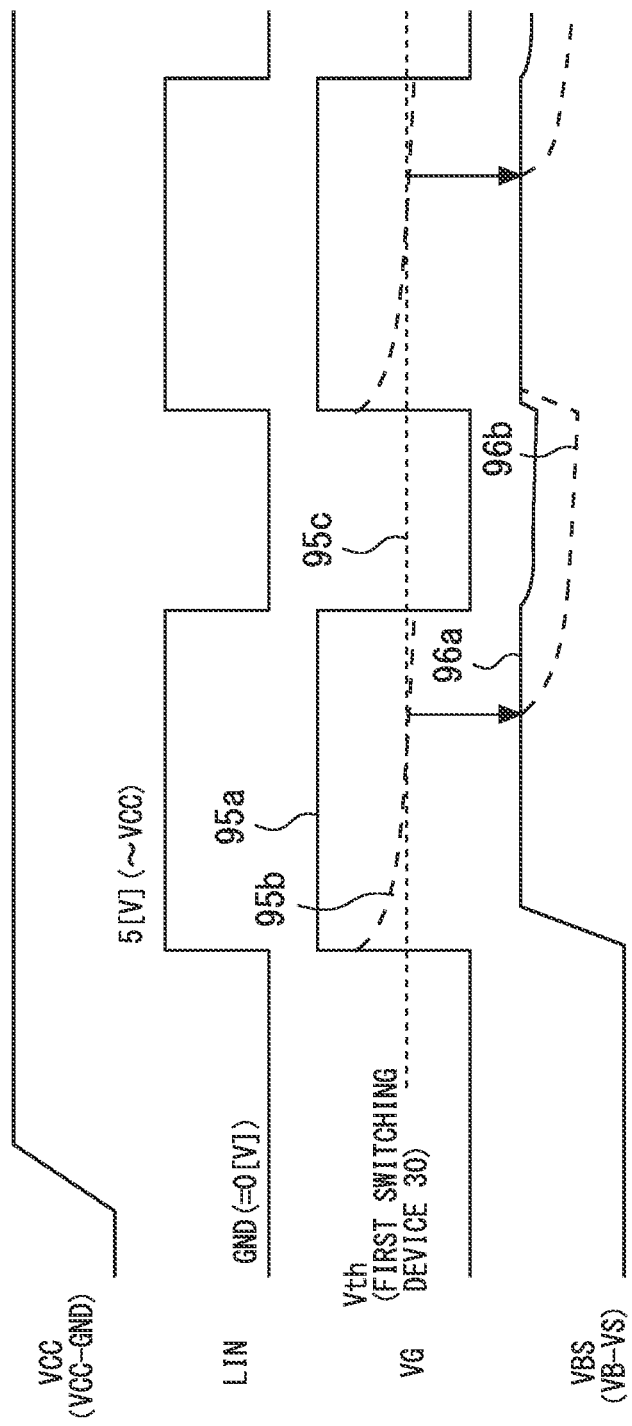
FIG. 17 is a diagram explaining a function of the booster circuit relating to the third embodiment.

FIG. 17 is a diagram explaining a function of the booster circuit 334 relating to the third embodiment. In FIG. 17, the voltage VG of the control terminal of the first switching device 30 is illustrated as a solid line 95a. In addition, the voltage VG of the drive circuit 800b illustrated in FIG. 8 is illustrated by a broken line 95b as the comparative example. Further, the voltage VBS of the present embodiment is illustrated by a solid line 96a. Furthermore, one example of the voltage VBS of the drive circuit 800b is illustrated by a broken line 96b as the comparative example.

In the comparative example, the voltage VG depends on the power supply VCC. Therefore, there is the risk that the voltage VGS fluctuates depending on the voltage of the power supply VCC. Thus, there is the risk that sufficient charging power cannot be obtained when the voltage of the power supply VCC is low. In addition, when the voltage of the power supply VCC is high, there is the risk that the voltage VGS exceeds the withstand voltage of the gate oxide film of the HVMOS 830 and the breakdown occurs.

In addition, in the drive circuit 800b relating to the comparative example, a gate terminal of the HVMOS 830 is turned to a HiZ state during boosting. Therefore, there is the risk that the voltage VG declines as illustrated by the broken line 95b due to influence of gate leakage or junction leakage or the like during a low frequency operation or during a high temperature operation in particular. At the time, since the voltage VG becomes lower than the threshold Vth illustrated by a broken line 95c, there is the risk that the HVMOS 830 cannot maintain the on state and the voltage VBS declines as illustrated by the broken line % b. That is, there is the possibility that charging cannot be stably executed. In addition, when a capacitor of a large capacity is provided in order to retain the voltage VG of the HVMOS 830, delay of the boosting operation increases.

In contrast, in the present embodiment, two booster circuits synchronized with the signals of the opposite phases are provided. In particular, the booster circuits in two stages are driven by the oscillation circuit 350, and continuously excite the control terminal of the first switching device 30 by a charge pump operation. Thus, the stable boosting operation can be achieved even during the low frequency operation or during the high temperature operation. In addition, there is no need to provide the capacitor of the large capacity in order to retain the voltage VG, and retainment of the voltage VG and the high-speed operation can be made compatible.

Figure 18:
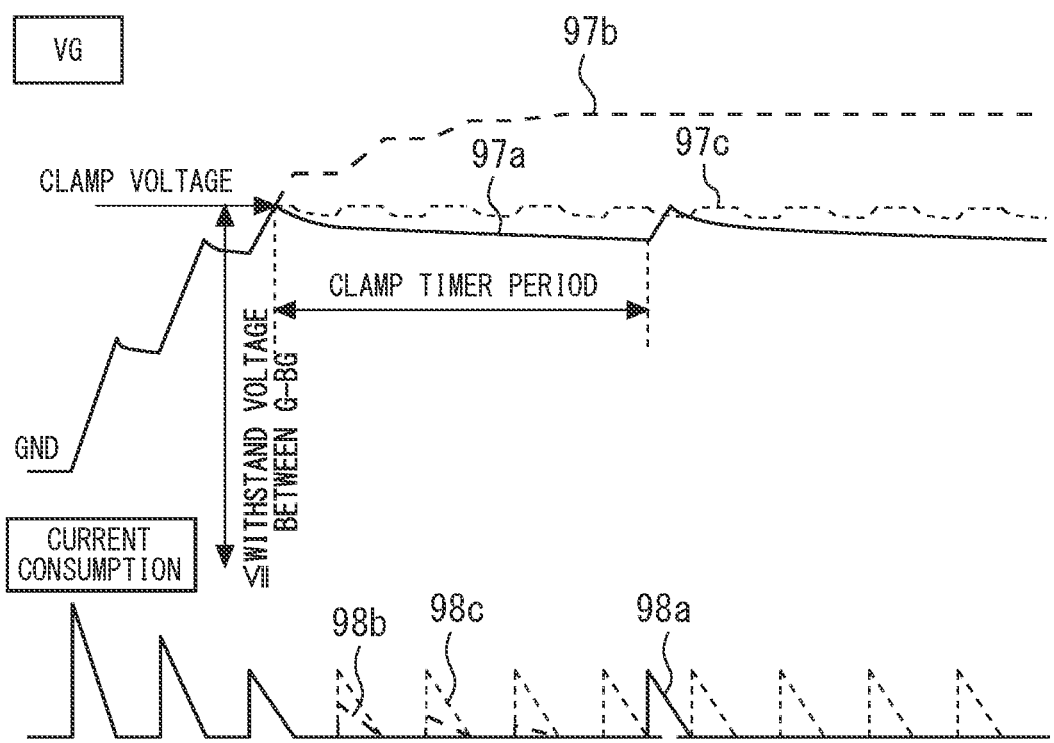
FIG. 18 is a diagram explaining a function of the clamp circuit and the timer circuit 348 relating to the third embodiment.

FIG. 18 is a diagram explaining a function of the clamp circuit 344 and the timer circuit 348 relating to the third embodiment. In FIG. 18, the voltage VG of the control terminal of the first switching device 30 is illustrated as a solid line 97a. In addition, the voltage VG in the case without the clamp circuit 344 is illustrated by a broken line 97b as the comparative example. Further, the voltage VG in the case without the timer circuit 348 is illustrated by a broken line 97c as the comparative example. In addition, in FIG. 18, current consumption of the power supply VCC accompanying the boosting operation is illustrated as a solid line 98a. Further, the current consumption in the case without the clamp circuit 344 is illustrated by a broken line 98b as the comparative example. Furthermore, the current consumption in the case without the timer circuit 348 is illustrated by a broken line 98c as the comparative example.

In the case without the clamp circuit 344, as illustrated by the broken line 97b, there is the risk that the voltage VG exceeds a withstand voltage between the gate and the backgate of the first switching device 30. The withstand voltage between the gate and the backgate is pertinent to a gate oxide film withstand voltage. In the present embodiment, a clamp voltage can be arbitrarily set. Therefore, the voltage VG can be suppressed from exceeding the withstand voltage of the first switching device 30.

In addition, in the case without the timer circuit 348, as illustrated by the broken line 97c, the clamp is continuously applied during charge pump. At the time, the electric charge for boosting becomes the waste current as illustrated by the broken line 98c. In contrast, in the present embodiment, when the clamp detection circuit 346 detects the voltage clamp, the timer circuit 348 stops the boosting operation for a clamp timer period. Thus, the excessive boosting operation can be reduced, and the current consumption can be suppressed.

Fourth Embodiment

Figure 19:
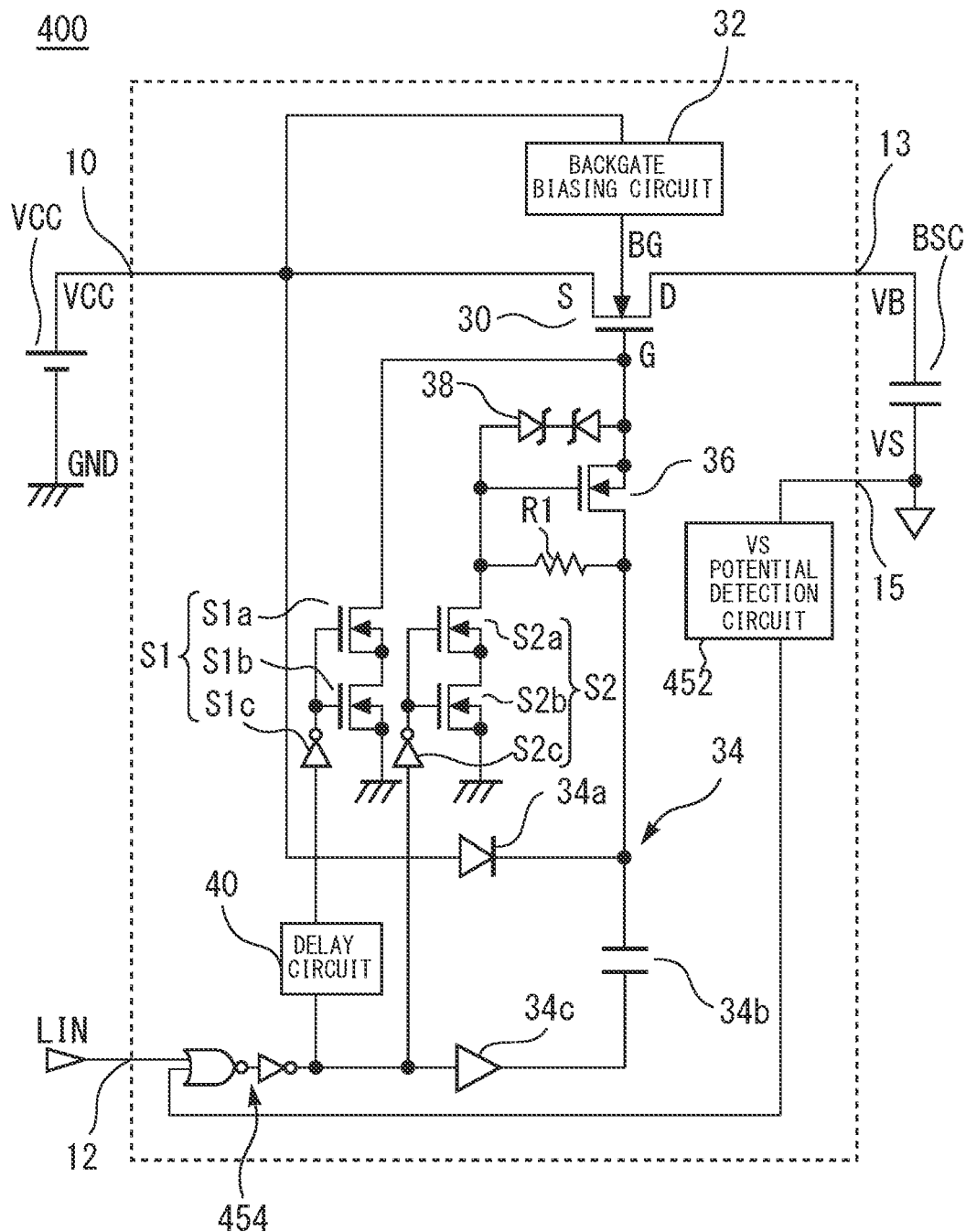
FIG. 19 is a diagram illustrating a configuration of a drive circuit relating to the fourth embodiment.

FIG. 19 is a diagram illustrating a configuration of a drive circuit 400 relating to the fourth embodiment. The drive circuit 400 is different from the drive circuit 100 at a point of including a VS potential detection circuit 452 and an arithmetic circuit 454. The VS potential detection circuit 452 is a voltage detection circuit which outputs the enable signal when the voltage VS at the connection point of the upper arm 81 and the lower arm 82 is equal to or lower than a predetermined value.

The arithmetic circuit 454 outputs the control signal with which the booster circuit 34 is synchronized. The arithmetic circuit 454 outputs the control signal so as to be at the high level when the low voltage side control signal LIN is at the high level or the enable signal is inputted, and to be at the low level when the low voltage side control signal LIN is at the low level and the enable signal is not inputted.

The drive circuit 800b relating to the comparative example estimates that the lower arm 82 is in the on state when the low voltage side control signal LIN is at the high level, and charges the power supply VB. At the time, there is the risk that a charging period is short and charging is insufficient. Actually, even in a period during which the low voltage side control signal LIN is not at the high level, there is the state where the voltage VS is 0 V. For example, the voltage VS becomes 0 V immediately after the power supply VCC is supplied and before driving the inverter circuit 80.

In the present embodiment, the control signal is generated by calculating the low voltage side control signal LIN and the enable signal from the VS potential detection circuit 452. The VS potential detection circuit 452 detects the voltage VS, and sets the control signal at the high level regardless of the value of the low voltage side control signal LIN when the voltage VS is equal to or lower than the predetermined value. Thus, the sufficient charging period of the power supply VB can be secured, and charging insufficiency can be suppressed. That is, the charging period similar to that of an external bootstrap power supply system as illustrated in FIG. 5 can be secured.

Figure 20:
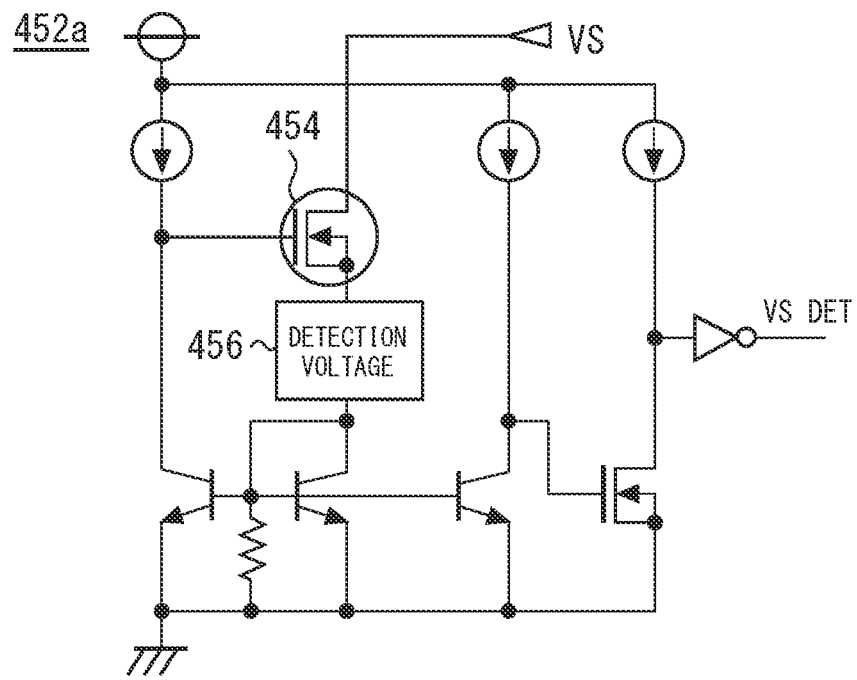
FIG. 20 is a diagram illustrating one example of the VS potential detection circuit relating to the fourth embodiment.

FIG. 20 is a diagram illustrating one example of the VS potential detection circuit 452 relating to the fourth embodiment. As the VS potential detection circuit 452, a VS potential detection circuit 452a of a voltage detection type can be adopted. The VS potential detection circuit 452a includes a Wilson current mirror circuit. In the VS potential detection circuit 452a, when the voltage VS rises and exceeds a set voltage predetermined in a detection voltage setting circuitry 456, an HVMOS 454 is turned on. Thus, a current mirror is operated. Accompanying the operation of the current mirror, the low level is outputted as a VSDET signal. When the voltage VS is equal to or lower than the set voltage of the detection voltage setting circuitry 456, the current mirror is turned to a saturated state and is not operated. That is, the high level is outputted as the VSDET signal. The set voltage of the detection voltage setting circuitry 456 is set by the diode, the Zener diode and the resistor or the like.

Figure 21:
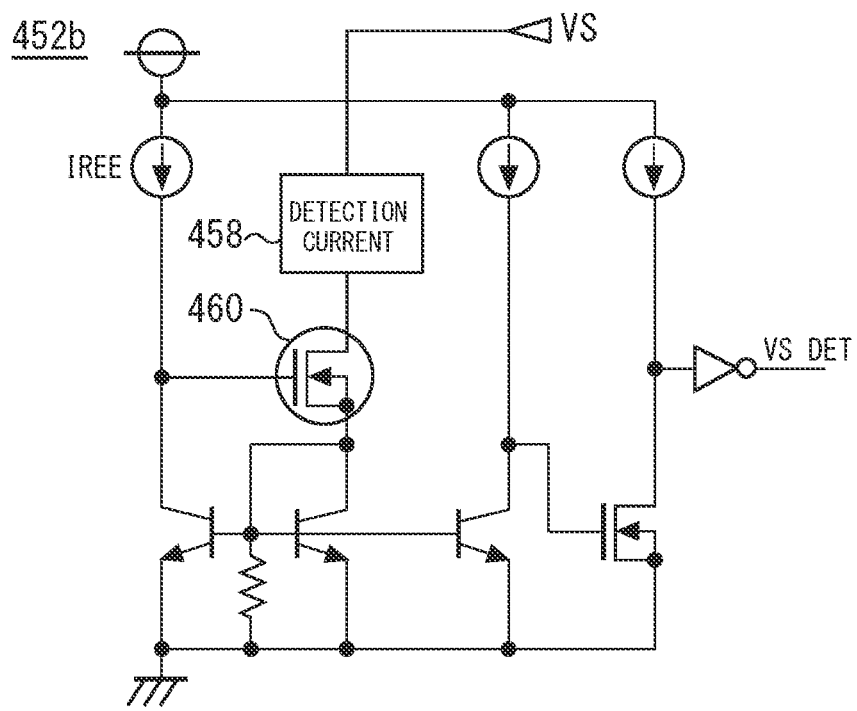
FIG. 21 is a diagram illustrating a modification of the VS potential detection circuit relating to the fourth embodiment.

FIG. 21 is a diagram illustrating a modification of the VS potential detection circuit 452 relating to the fourth embodiment. As the VS potential detection circuit 452, a VS potential detection circuit 452*b* of a current detection type may be adopted. In the VS potential detection circuit 452*b*, when the voltage VS rises and a current value corresponding to the voltage generated at both ends of a detection current setting circuitry 458 becomes equal to or larger than IREF, an HVMOS 460 is turned on. Thus, the current mirror is operated. Accompanying the operation of the current mirror, the low level is outputted as the VSDET signal. When the current value corresponding to the voltage generated at both ends of the detection current setting circuitry 458 is equal to or smaller than the IREF, the current mirror is turned to the saturated state and is not operated. That is, the high level is outputted as the VSDET signal. The IREF is set by the resistor or the like.

Fifth Embodiment

Figure 22:
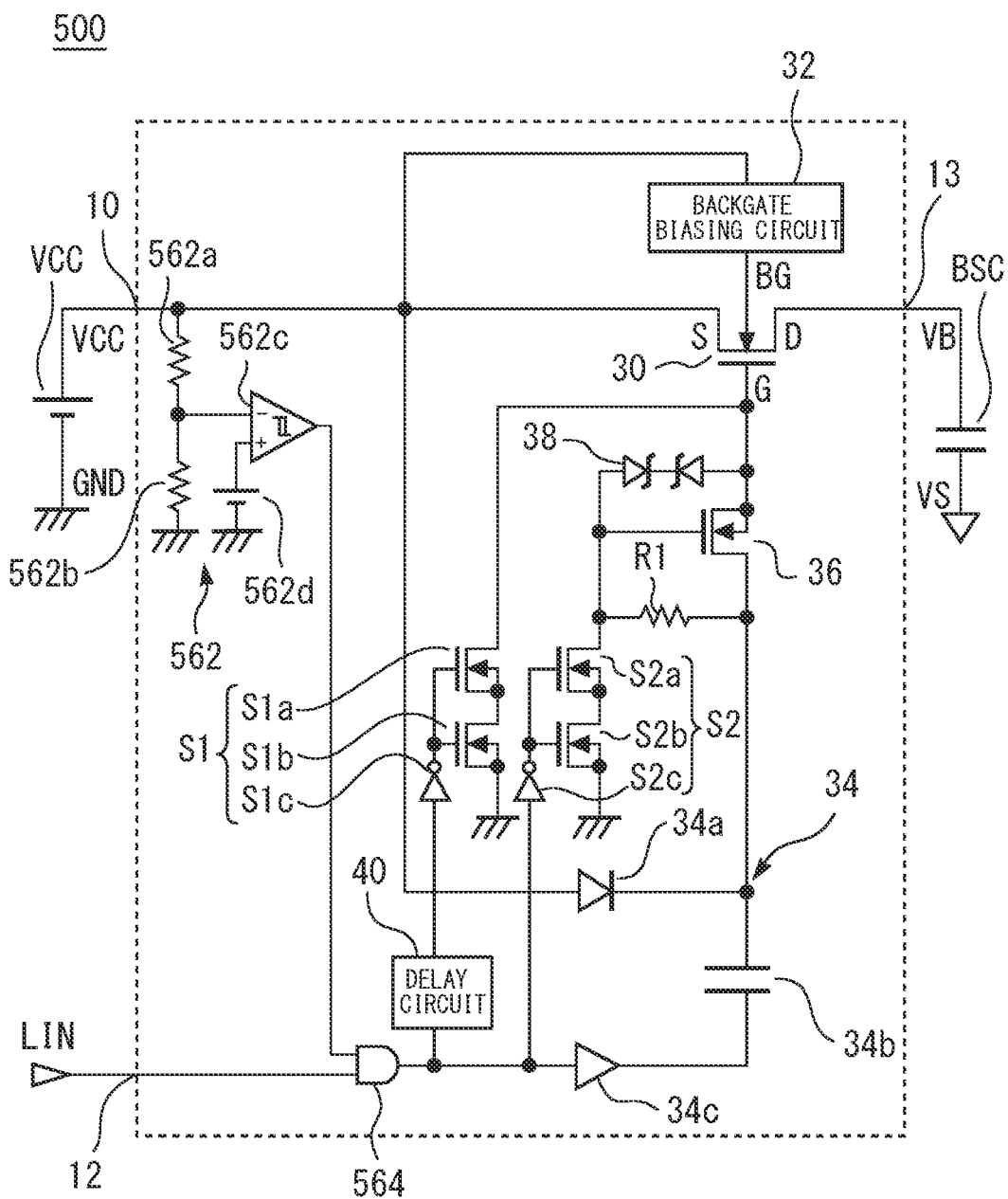
FIG. 22 is a diagram illustrating a configuration of a drive circuit relating to the fifth embodiment.

FIG. 22 is a diagram illustrating a configuration of a drive circuit 500 relating to the fifth embodiment. The drive circuit 500 is different from the drive circuit 100 at the point of including a voltage detection circuit 562 and an arithmetic circuit 564. The voltage detection circuit 562 includes a series circuit of resistors 562*a* and 562*b*. The series circuit of the resistors 562*a* and 562*b* is connected between the power supply VCC and the terminal for grounding. To a connection point of the resistors 562*a* and 562*b*, one of the input of a comparator 562*c* is connected. To the other input of the comparator 562*c*, a reference power supply 562*d* is connected. The output of the comparator 562*c* is connected to the arithmetic circuit 564.

The comparator 562*c* compares the voltage for which the power supply VCC is voltage-divided and the voltage of the reference power supply 562*d*, and outputs a comparison result to the arithmetic circuit 564. In this way, the voltage detection circuit 562 outputs the enable signal when the voltage of the power supply VCC supplied to the second driver 22 is equal to or lower than the predetermined value.

The arithmetic circuit 564 outputs the control signal so as to be at the high level when the low voltage side control signal LIN is at the high level and the enable signal is inputted, and to be at the low level when the low voltage side control signal LIN is at the low level or the enable signal is not inputted.

The voltage detection circuit 562 is an overvoltage detection circuit which detects the rise of the power supply VCC and stops the drive of the first switching device 30. The voltage of the reference power supply 562*d* is set so as to coincide with the voltage at the connection point of the resistors 562*a* and 562*b* when the power supply VCC is turned to an overvoltage state. When the power supply VCC is within a recommended operation range, the output of the comparator 562*c* becomes the high level corresponding to the enable signal.

In the case where the voltage VS rises while charging the power supply VB or in the case where a drive signal is supplied to the first switching device 30 in the state where the voltage VS is high, there is the possibility that the above-described reverse current mode occurs. When the reverse current mode occurs, the power supply VCC rises. In the present embodiment, in the case where the power supply VCC exceeds the recommended operation range and is turned to the overvoltage state in an absolute maximum rating range, the output of the comparator 562*c* becomes the low level. At the time, the control signal is at the low level regardless of the value of the low voltage side control signal LIN. Thus, the drive of the first switching device 30 is stopped. From the above, the breakdown due to the power supply VCC rising and exceeding a device withstand voltage can be suppressed.

In addition, the comparator 562*c* may be provided with a hysteresis. After the overvoltage is detected, a threshold of the comparator 562*c* declines by a fixed level. The threshold after the decline is set to be within the recommended operation range of the power supply VCC. Thus, the first switching device 30 can be driven after the power supply VCC declines to a sufficiently safe level.

Sixth Embodiment

Figure 23:
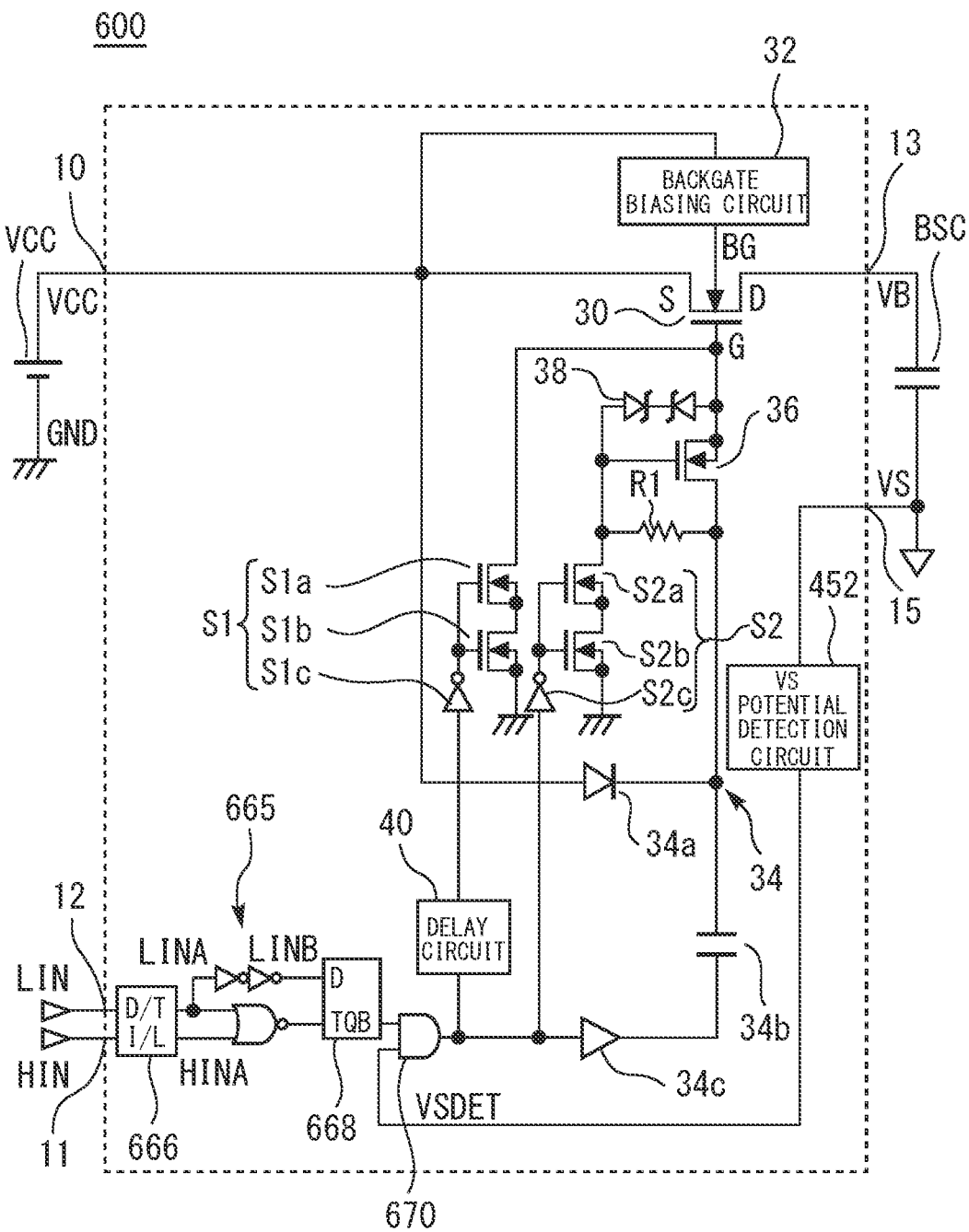
FIG. 23 is a diagram illustrating a configuration of a drive circuit relating to the sixth embodiment.

FIG. 23 is a diagram illustrating a configuration of a drive circuit 600 relating to the sixth embodiment. The drive circuit 600 is different from the drive circuit 100 at the point of including the VS potential detection circuit 452 and an arithmetic circuit 665. The VS potential detection circuit 452 is the voltage detection circuit which outputs the enable signal when the voltage VS at the connection point of the upper arm 81 and the lower arm 82 is equal to or lower than the predetermined value.

The arithmetic circuit 665 includes a dead time adjustment circuit 666. The dead time adjustment circuit 666 outputs a signal LINA and a signal HINA according to the low voltage side control signal LIN and the high voltage side control signal HIN. In addition, the arithmetic circuit 665 includes a D flip-flop 668. To a clock of the D flip-flop 668, the negative OR of the signal LINA and the signal HINA is inputted. To D input of the D flip-flop 668, a signal LINB for which the signal LINA is delayed is inputted. The AND of the output of the VS potential detection circuit 452 and an intermediate signal QB which is the output of the D flip-flop 668 is inputted to the booster circuit 34 as the control signal.

Figure 24:
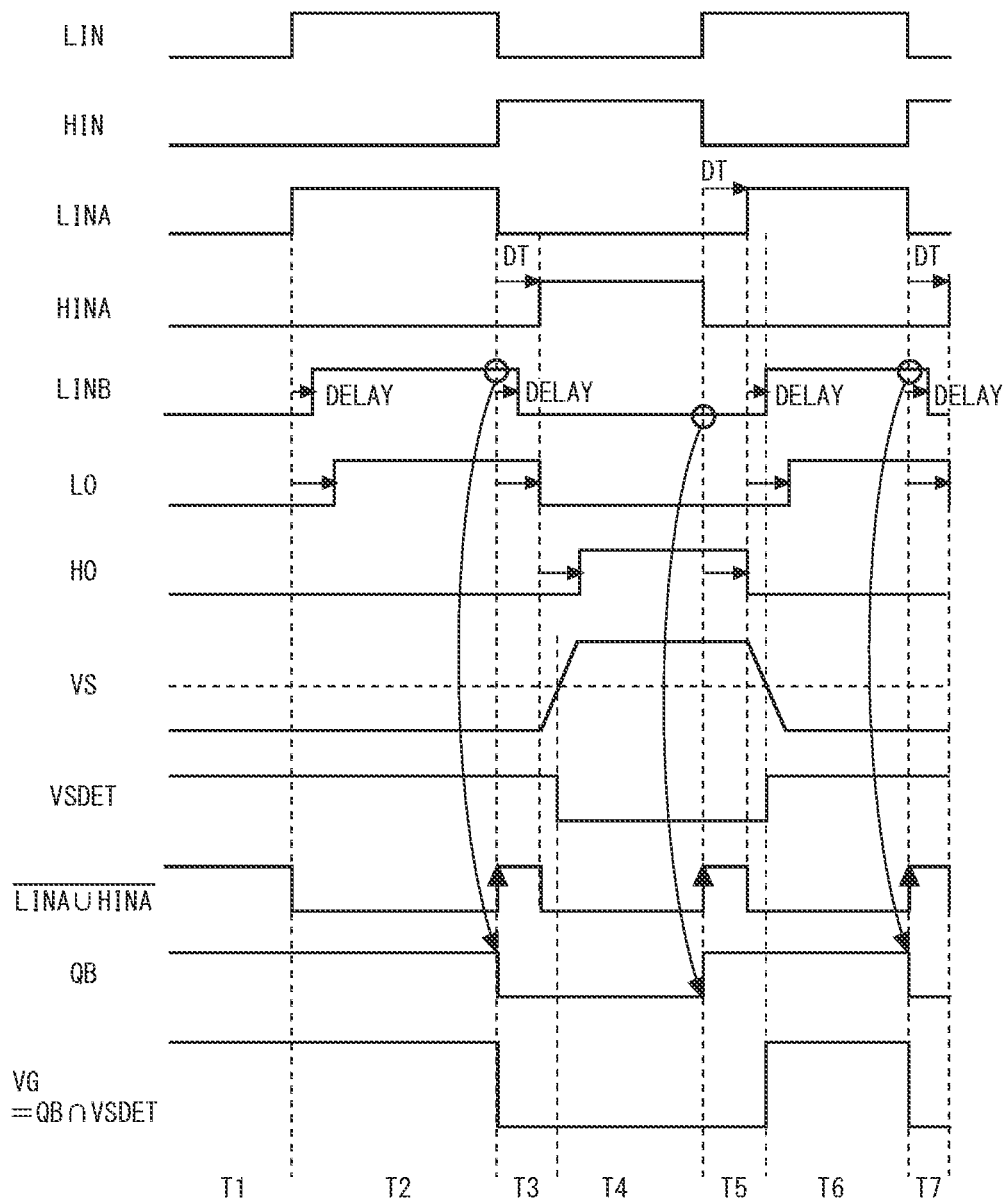
FIG. 24 is a diagram illustrating a waveform of the drive circuit relating to the sixth embodiment.

FIG. 24 is a diagram illustrating a waveform of the drive circuit 600 relating to the sixth embodiment. The intermediate signal QB is switched from the low level to the high level according to a fall of the high voltage side control signal HIN, and is switched from the high level to the low level according to the fall of the low voltage side control signal LIN. The arithmetic circuit 665 outputs the control signal so as to be at the high level when the intermediate signal QB is at the high level and the enable signal is inputted, and to be at the low level when the intermediate signal QB is at the low level or the enable signal is not inputted.

Depending on a kind of the load 90 connected to the inverter circuit 80, a signal to be a cause of the VS potential fluctuation is different. Examples of the load 90 are an inductive load and a capacitive load. In the present embodiment, it is assumed that the load 90 of the inverter circuit 80 is the inductive load, and the VS potential fluctuation is estimated using the low voltage side control signal LIN and the high voltage side control signal HIN. The inductive load is a motor for example.

First, an occurrence condition of a positive VS potential fluctuation will be described. It is assumed that, from the state where the low voltage side output signal LO is at the high level and the lower arm 82 is on, the low voltage side output signal LO is shifted to the low level. At the time, by energy accumulated in the inductor of the load 90, the current returns to the diode of the upper arm 81. At the time, positive displacement occurs in the VS potential.

Next, the occurrence condition of a negative VS potential fluctuation will be described. It is assumed that, from the state where the high voltage side control signal HIN is at the high level and the upper arm 81 is on, the high voltage side output signal HO is shifted to the low level. At the time, by the energy accumulated in the inductor of the load 90, the current returns from the diode of the lower arm 82. At the time, negative displacement occurs in the VS potential.

As in a period T1 illustrated in FIG. 24, the intermediate signal QB is at the high level in an initial state after the power is supplied. At the time, when the voltage VS is equal to or lower than the predetermined value and it is VSDET=H, the control signal becomes the high level. That is, the voltage VG becomes the high level and the first switching device 30 is turned to the on state. At the time, boosting of the booster circuit 34 and charging of the power supply VB are executed.

In a period T2, the low voltage side control signal LIN is shifted from the low level to the high level. The transition is not the occurrence condition of the VS potential fluctuation.

Therefore, the voltage VG maintains the high level, and the boosting of the booster circuit 34 and the charging the power supply VB are continued.

In a period T3, the low voltage side control signal LIN is shifted from the high level to the low level. The transition is the occurrence condition of the positive VS potential fluctuation. Therefore, the voltage VG becomes the low level before the gate logic of the lower arm 82 changes, and the boosting of the booster circuit 34 and the charging the power supply VB are stopped. Also in a period T4, the stop state is maintained for the boosting of the booster circuit 34 and the charging the power supply VB.

In a period T5, the high voltage side control signal HIN is shifted from the high level to the low level. The transition is the occurrence condition of the negative VS potential fluctuation. At the time, the intermediate signal QB becomes the high level. However, it is before the VS potential fluctuation occurs at the point of time, and since it is VSDET=L, the voltage VG is maintained at the low level. That is, the stop state is maintained for the boosting of the booster circuit 34 and the charging of the power supply VB.

In a period T6, the VS potential fluctuation occurs and it becomes VSDET=H. Thus, the voltage VG becomes the high level, and the boosting of the booster circuit 34 and the charging of the power supply VB are started. A period T7 is similar to the period T3.

As described above, in the drive circuit 800b relating to the comparative example, since the power supply VB is charged only when the low voltage side control signal LIN is at the high level, there is the risk that the charging period becomes insufficient. In the present embodiment, in the case that the load 90 is the inductive load, the VS potential can be estimated in detail using the low voltage side control signal LIN, the high voltage side control signal HIN and the VS potential detection circuit 452. Thus, the sufficient charging period can be secured. In addition, when the VS potential is high, the occurrence of the reverse current mode due to turning on of the first switching device 30 can be suppressed. Thus, a highly stable and highly efficient charging operation can be achieved.

Meanwhile, technical features explained in each embodiment may be appropriately combined to use.

In the drive circuit and the inverter device relating to the present disclosure, a second switching device which causes interruption between a booster circuit and a control terminal of a first switching device is provided. Therefore, the first switching device can be turned off in a state where electric charges are accumulated in the booster circuit. Thus, transition to the on state of the first switching device can be accelerated, and the high-speed operation is made possible.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2020-143766, filed on Aug. 27, 2020 including specification, claims, drawings and summary, on which the Convention priority of the present application is based, are incorporated herein by reference in its entirety.

The invention claimed is:

1. A drive circuit comprising:
  a first driver configured to control on/off of an upper arm of an inverter circuit;
  a second driver configured to control on/off of a lower arm of the inverter circuit;
  a first switching device including a first terminal, a second terminal and a control terminal configured to control on/off between the first terminal and the second terminal, the first terminal of which is connected with a power supply supplied to the first driver, and the second terminal of which is connected with a power supply supplied to the second driver;
  a booster circuit configured to turn on the first switching device by boosting a control signal which is at a high level when the lower arm is in an on state and is at a low level when the lower arm is in an off state and performing supply to the control terminal;
  a second switching device connected between the control terminal and the booster circuit, and configured to cause continuity between the control terminal and the booster circuit when the control signal is at the high level and cause interruption between the control terminal and the booster circuit when the control signal is at the low level; and
  a first switch unit configured to cause interruption between the control terminal and a terminal for grounding when the control signal is at the high level and short-circuit the control terminal and the terminal for grounding when the control signal is at the low level,
  wherein a current flows from the power supply supplied to the second driver to the power supply supplied to the first driver when the first switching device is turned on, and the power supply supplied to the first driver is charged.

2. The drive circuit according to claim 1,
  wherein the second driver controls on/off of the lower arm according to a low voltage side control signal, and
  the control signal is synchronized with the low voltage side control signal.

3. The drive circuit according to claim 1, comprising a backgate biasing circuit,
  wherein the first switching device is an LDMOS transistor for which the backgate biasing circuit is connected to a backgate.

4. The drive circuit according to claim 1,
  wherein
  the first switching device including:
  a semiconductor layer of a first conductivity type;
  a first semiconductor region of a second conductivity type electrically connected with the first terminal and formed on a surface of the semiconductor layer;
  a second semiconductor region of the first conductivity type formed adjacently to the first semiconductor region on the surface of the semiconductor layer;

a third semiconductor region of the second conductivity type electrically connected with the second terminal and formed on a surface of the second semiconductor region; and a backgate electrode electrically connected to a region separated from the third semiconductor region in the second semiconductor region and electrically connected with the terminal for grounding, the control terminal is connected via a gate insulating film to a channel region between the third semiconductor region and the first semiconductor region, and a breakdown voltage between the second terminal and the backgate electrode is larger than a voltage of the power supply supplied to the second driver.

5. The drive circuit according to claim 1, wherein the booster circuit includes a first booster circuit and a second booster circuit configured to boost a signal of a phase opposite to the first booster circuit.

6. The drive circuit according to claim 1, comprising a clamp circuit configured to control a voltage supplied from the booster circuit to the control terminal to be equal to or lower than a predetermined threshold voltage.

7. The drive circuit according to claim 6, comprising a timer circuit configured to stop a boosting operation of the booster circuit for predetermined time, when the clamp circuit detects that the voltage supplied from the booster circuit to the control terminal has reached the threshold voltage.

8. The drive circuit according to claim 1, comprising:
a voltage detection circuit configured to output an enable signal when a voltage at a connection point of the upper arm and the lower arm is equal to or lower than a predetermined value; and
an arithmetic circuit,
wherein the second driver controls on/off of the lower arm according to a low voltage side control signal, and
the arithmetic circuit outputs the control signal so as to be at the high level when the low voltage side control signal is at the high level or the enable signal is inputted, and to be at the low level when the low voltage side control signal is at the low level and the enable signal is not inputted.

9. The drive circuit according to claim 1, comprising:
a voltage detection circuit configured to output an enable signal when a voltage of the power supply supplied to the second driver is equal to or lower than a predetermined value; and
an arithmetic circuit,
wherein the second driver controls on/off of the lower arm according to a low voltage side control signal, and
the arithmetic circuit outputs the control signal so as to be at the high level when the low voltage side control signal is at the high level and the enable signal is inputted, and to be at the low level when the low voltage side control signal is at the low level or the enable signal is not inputted.

10. The drive circuit according to claim 1, comprising:
a voltage detection circuit configured to output an enable signal when a voltage at a connection point of the upper arm and the lower arm is equal to or lower than a predetermined value; and
an arithmetic circuit,
wherein the first driver controls on/off of the upper arm according to a high voltage side control signal,
the second driver controls on/off of the lower arm according to a low voltage side control signal, and the arithmetic circuit outputs the control signal so as to be at the high level when an intermediate signal to be switched from the low level to the high level according to a fall of the high voltage side control signal and to be switched from the high level to the low level according to a fall of the low voltage side control signal is at the high level and the enable signal is inputted, and to be at the low level when the intermediate signal is at the low level or the enable signal is not inputted.

11. The drive circuit according to claim 10, wherein a load of the inverter circuit is an inductive load.

12. The drive circuit according to claim 1, wherein the second switching device is an NMOS.

13. The drive circuit according to claim 1, comprising:
a second switch unit configured to set the second switching device to the on state when the control signal is at the high level, and set the second switching device to the off state when the control signal is at the low level; and
a limiting resistor connected between a connection point of the booster circuit and the second switching device and a connection point of the second switch unit and the second switching device.

14. The drive circuit according to claim 1, comprising a delay circuit configured to delay an operation according to the control signal of the first switch unit relative to an operation according to the control signal of the second switching device.

15. An inverter device comprising:
an inverter circuit including an upper arm and a lower arm;
a drive circuit; and
a first power supply connected between a connection point of the upper arm and the lower arm and the drive circuit,
wherein the drive circuit includes
a first driver configured to be supplied with the first power supply and control on/off of the upper arm,
a second driver configured to be supplied with a second power supply and control on/off of the lower arm,
a first switching device including a first terminal, a second terminal and a control terminal configured to control on/off between the first terminal and the second terminal, the first terminal of which is connected with the first power supply, and the second terminal of which is connected with the second power supply,
a booster circuit configured to turn on the first switching device by boosting a control signal which is at a high level when the lower arm is in an on state and is at a low level when the lower arm is in an off state and performing supply to the control terminal,
a second switching device connected between the control terminal and the booster circuit, and configured to cause continuity between the control terminal and the booster circuit when the control signal is at the high level and cause interruption between the control terminal and the booster circuit when the control signal is at the low level, and
a first switch unit configured to cause interruption between the control terminal and a terminal for grounding when the control signal is at the high level and short-circuit the control terminal and the terminal for grounding when the control signal is at the low level, and
a current flows from the second power supply to the first power supply when the first switching device is turned on, and the first power supply is charged.

16. The inverter device according to claim 15, wherein at least one of the upper arm and the lower arm is made with a wide bandgap semiconductor.

17. The inverter device according to claim 16, wherein the wide bandgap semiconductor is silicon carbide, a gallium-nitride-based material or diamond.

* * * * *